(12) United States Patent
Hidaka

(10) Patent No.: US 7,646,627 B2
(45) Date of Patent: Jan. 12, 2010

(54) MAGNETIC RANDOM ACCESS MEMORY HAVING IMPROVED READ DISTURB SUPPRESSION AND THERMAL DISTURBANCE RESISTANCE

(75) Inventor: Hideto Hidaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 32 days.

(21) Appl. No.: 11/802,010

(22) Filed: May 18, 2007

(65) Prior Publication Data
US 2007/0268737 A1 Nov. 22, 2007

(30) Foreign Application Priority Data
May 18, 2006 (JP) .............................. 2006-139013

(51) Int. Cl.
*G11C 11/00* (2006.01)
(52) U.S. Cl. .................... 365/158; 365/148; 365/32; 365/33; 365/50; 365/55; 365/66; 365/131; 365/171
(58) Field of Classification Search ............ 365/32, 365/36, 46, 50, 55, 66, 131, 158, 197, 209, 365/230.07, 232, 243.5
See application file for complete search history.

(56) References Cited
U.S. PATENT DOCUMENTS 6,349,054 B1 * 2/2002 Hidaka ..................... 365/173

| | | | |
|---|---|---|---|
| 6,677,877 B2 * | 1/2004 | Johnson et al. | 341/155 |
| 7,170,776 B2 * | 1/2007 | Ooishi | 365/158 |
| 7,381,480 B2 * | 6/2008 | Nakamura et al. | 428/811.5 |
| 7,382,664 B2 * | 6/2008 | Le Phan | 365/189.04 |
| 2004/0252551 A1 * | 12/2004 | Iwata et al. | 365/158 |
| 2005/0195662 A1 * | 9/2005 | Ooishi | 365/189.05 |
| 2006/0154381 A1 * | 7/2006 | Gaidis et al. | 438/3 |
| 2007/0133265 A1 * | 6/2007 | Tsuji | 365/158 |
| 2007/0285975 A1 * | 12/2007 | Kawahara et al. | 365/158 |

FOREIGN PATENT DOCUMENTS

| | | |
|---|---|---|
| JP | 2004-111904 | 4/2004 |
| JP | 2004-326951 | 11/2004 |
| JP | 2005-011907 | 1/2005 |
| JP | 2005-092912 | 4/2005 |

* cited by examiner

*Primary Examiner*—Amir Zarabian
*Assistant Examiner*—Fernando N Hidalgo
(74) *Attorney, Agent, or Firm*—McDermott Will & Emery LLP

(57) ABSTRACT

Between the value of an electric current and the supply duration for which the electric current is supplied that cause magnetization reversal, there is the relation of monotonous decrease. This means that, as the supply duration is shortened, the threshold current value for causing the magnetization reversal is larger. Therefore, in terms of suppressing occurrence of read disturb, the read current supply duration may be shortened to increase the threshold value of the current causing the magnetization reversal and thereby ensure a sufficient read disturb margin. Therefore, the read current supply duration may be shortened relative to the write current supply duration ensure the read disturb margin and suppress occurrence of read disturb.

15 Claims, 15 Drawing Sheets

$I_w(0)$ $I_w(1)$

FIG.16
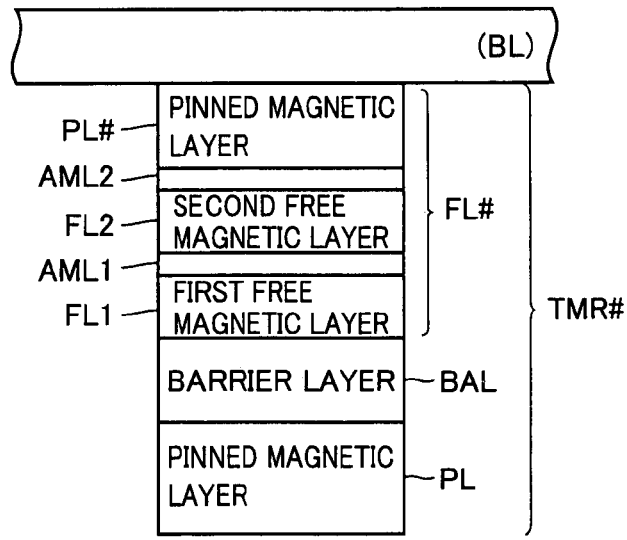
FIG.17A FIG.17B
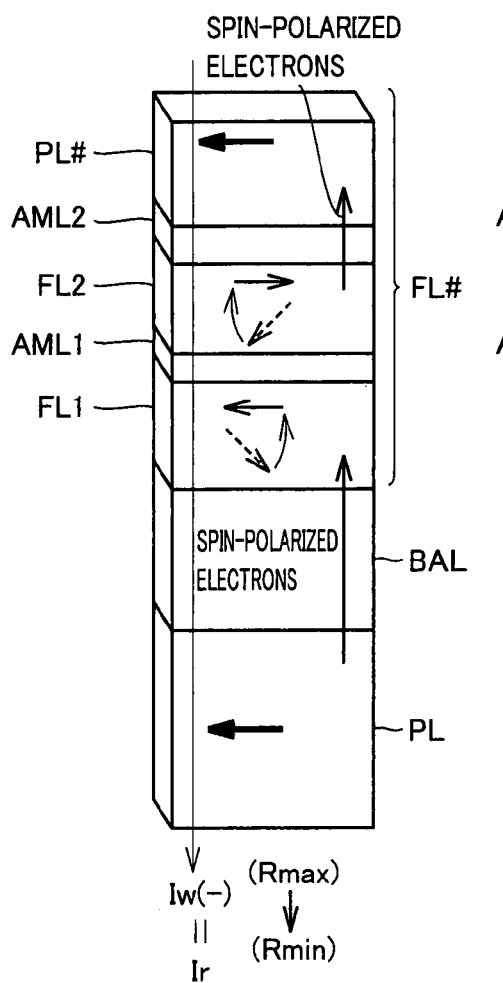
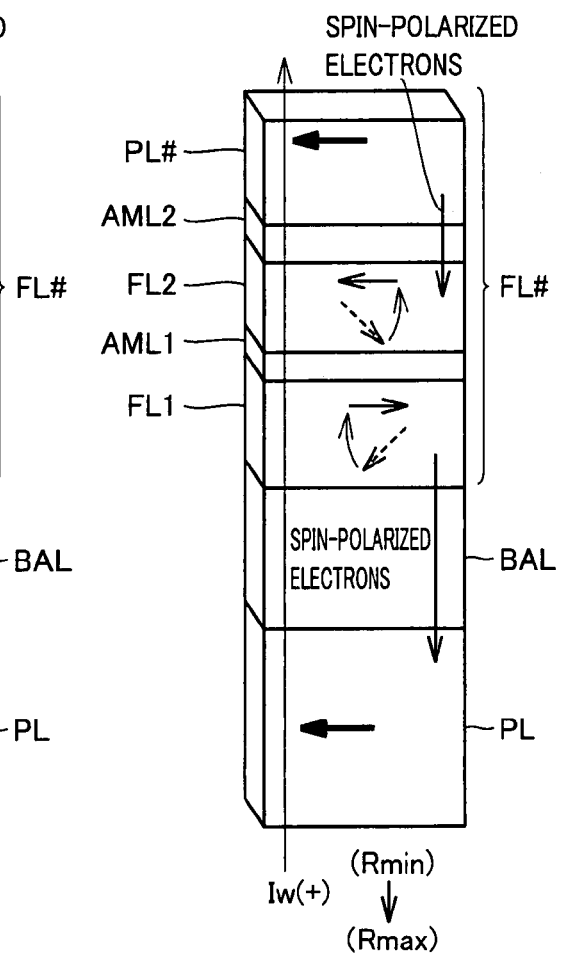

MAGNETIC RANDOM ACCESS MEMORY HAVING IMPROVED READ DISTURB SUPPRESSION AND THERMAL DISTURBANCE RESISTANCE

BACKGROUND OF THE INVENTION

1. Field of the Invention

The present invention relates to a nonvolatile memory device. In particular, the invention relates to a random-access memory including memory cells having magnetic tunnel junctions (MTJ).

2. Description of the Background Art

In recent years, an MRAM (Magnetic Random-Access Memory) device has been of great interest as a new-generation nonvolatile memory device. The MRAM device is a nonvolatile memory device in which a plurality of thin-film magnetic elements formed in a semiconductor integrated circuit are used to store data in nonvolatile manner, and the thin-film magnetic elements are each randomly accessible. In particular, recently it has been known that an MRAM device is remarkably improved in performance by employment of the thin-film magnetic element using a magnetic tunnel junction (MTJ) as a memory cell.

Generally, when data is to be read from a memory cell configured using such a thin-film magnetic element as described above, an electric current flowing through a tunneling magneto-resistance element (TMR element) therein or an end-to-end voltage of the TMR element can be measured to indirectly measure the electric resistance value of the TMR element and thereby read data.

It is now a particularly important challenge to reduce the cell area of the memory cell in order that such an MRAM device as described above may replace a main memory using a DRAM (Dynamic Random Access Memory) device.

However, supposing that a theoretical minimum cell area of a memory cell of a DRAM device which is now commonly used is $6F^2$, the theoretical minimum memory cell area of a memory cell of an MRAM device configured with one transistor and one TMR element is $12F^2$. Namely, the MRAM device requires the cell area twice as large as that of the DRAM device. This is for the reason that the memory cell of the MRAM device additionally requires word lines used for reading data as compared with the memory cell of the DRAM device.

Therefore, a memory cell based on the spin injection technique has recently been proposed that can accomplish a cell area equivalent to the cell area of the DRAM device (for example, Japanese Patent Laying-Open Nos. 2005-011907, 2004-111904 and 2005-092912). The memory cell based on the spin-injection technique differs from the currently-used MRAM device in terms of how data is written. For a memory cell of the currently-used MRAM device, a method is employed of allowing an electric current to flow through lines (including write word line) adjacent to a TMR element to generate magnetic fields and thereby reverse the direction of magnetization. In contrast, for a memory cell based on the spin-injection technique, a method is employed according to which an electric current is applied directly through a TMR element to reverse the direction of magnetization of the TMR element. The electric-current flow direction is changed to switch the direction of magnetization of a free layer to the parallel or antiparallel direction with respect to a fixed layer. This method is called the spin injection technique since the direction of magnetization is reversed using the action of spin-polarized electrons in the current. By employing the spin injection technique, the theoretical memory cell area of the MRAM device can be reduced to a half of that of the currently-used MRAM device.

The method of reading data of the MRAM device based on the spin injection technique is similar to that of the currently-used MRAM device. Specifically, an electric current flowing through a tunneling magneto-resistance element (TMR element) with which a memory cell is configured or an end-to-end voltage of the TMR element is measured to indirectly measure the electric resistance value of the TMR element and thereby read data. Therefore, in the MRAM device based on the spin injection technique, an electric current is applied to the TMR element in both of the data write and data read operations. Therefore, if the read current has a large value, an accidental data write occurs, resulting in a problem that the stored data is corrupted. This phenomenon is called "read disturb." If the read current value is decreased for avoiding the read disturb, the sense voltage level is also decreased to cause the problem that the data read speed, namely the access speed decreases.

When the temperature of the TMR element itself increases, the free layer becomes unstable and reversal of the magnetization direction is likely to occur. This phenomenon is called "thermal assist effect." The thermal assist effect largely depends on the electric-current supply duration for which the electric current is supplied. Therefore, even for the same read or write current, a longer electric-current supply duration leads to a higher possibility that reversal of the magnetization direction occurs.

Regarding the currently-used MRAM device as well, if the time for which a write magnetic field is applied and the time for which a read current is supplied from lines adjacent to the TMR element are longer, the temperature of the TMR element itself increases. A problem thus arises is that the reliability of storage data of a TMR element, namely the thermal disturbance resistance against the ambient temperature deteriorates.

SUMMARY OF THE INVENTION

The present invention has been made for solving the above-described problems. A first object of the invention is to provide a nonvolatile memory device writing data and reading data by supplying an electric current to a memory cell, for which the read disturb is suppressed and the access speed can be increased. A second object of the invention is to provide a nonvolatile memory device writing data by applying a write magnetic field generated by a write electric current, having an improved thermal disturbance resistance.

According to a first aspect of the present invention, a nonvolatile memory device includes: a plurality of memory cells arranged in rows and columns; first and second current supply lines provided correspondingly to each of the columns where the plurality of memory cells are arranged; and a data write and read circuit writing data by supplying a write current to a selected memory cell through the first and second current supply lines and reading data by supplying a read current to a selected memory cell through the first and second current supply lines. The plurality of memory cells each have a resistance value changeable in nonvolatile manner by receiving the write current flowing in a direction according to write data. The data write and read circuit reads data based on the resistance value of the selected memory cell detected by supplying the read current, and the data write and read circuit supplies the read current for a supply duration shorter than a supply duration for which the write current is supplied.

According to a second aspect of the present invention, a nonvolatile memory device includes: a plurality of memory cells arranged in rows and columns; first and second current supply lines provided correspondingly to each of the columns where the plurality of memory cells are arranged; and a data write and read circuit writing data by supplying a write current to a selected memory cell through the first and second current supply lines and reading data by supplying a read current to a selected memory cell through the first and second current supply lines. The plurality of memory cells each have a resistance value changeable in nonvolatile manner by receiving the write current flowing in a direction according to write data. The data write and read circuit reads data based on the resistance value of the selected memory cell detected by supplying the read current, and supplies the read current in a predetermined direction based on an absolute value of the write current required to change the resistance value for each direction in which the write current flows.

According to a third aspect of the present invention, a nonvolatile memory device includes: a plurality of memory cells storing data by applying a write magnetic field generated by a write current flowing in a direction according to write data; a write line disposed adjacent to the plurality of memory cells each for flowing the write current; a data write circuit supplying the write current to a plurality of the write lines; first and second read lines connected to the plurality of memory cells each; and a data read circuit reading data based on a resistance value of the memory cell detected by supplying an electric current to the first and second read lines. The data write circuit supplies the write current for a supply duration shorter than a time constant of a temperature increase of the memory cell caused by application of the write magnetic field.

The nonvolatile memory device according-to the first aspect supplies the read current for the supply duration shorter than the supply duration of the write current. Therefore, as compared with the thermal assist effect due to the write current, the thermal assist effect due to the read current can be suppressed. Accordingly, the nonvolatile memory device can be implemented for which the read disturb can be suppressed without making memory cells unstable in reading data and the access speed can be increased.

The nonvolatile memory device according to the second aspect determines the direction in which the read current is flown based on the absolute value of the write current required to change the resistance value for each direction in which the write current flows. Therefore, the direction of the read current can be selected that allows the thermal assist effect to be relatively smaller. Accordingly, the nonvolatile memory device can be implemented for which the read disturb can be suppressed without making memory cells unstable in reading data and the access speed can be increased.

The nonvolatile memory device according to the third aspect supplies the write current for the supply duration shorter than a time constant of a temperature increase of a memory cell caused by application of a write magnetic field. Accordingly, the nonvolatile memory device having an increased thermal disturbance resistance in writing data can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 conceptually illustrates a memory cell MC according to a third embodiment of the present invention.

FIGS. 17A and 17B illustrate reversal of the magnetization direction of the memory cell MC according to the third embodiment of the present invention.

DESCRIPTION OF THE PREFERRED EMBODIMENTS

Figure 1:
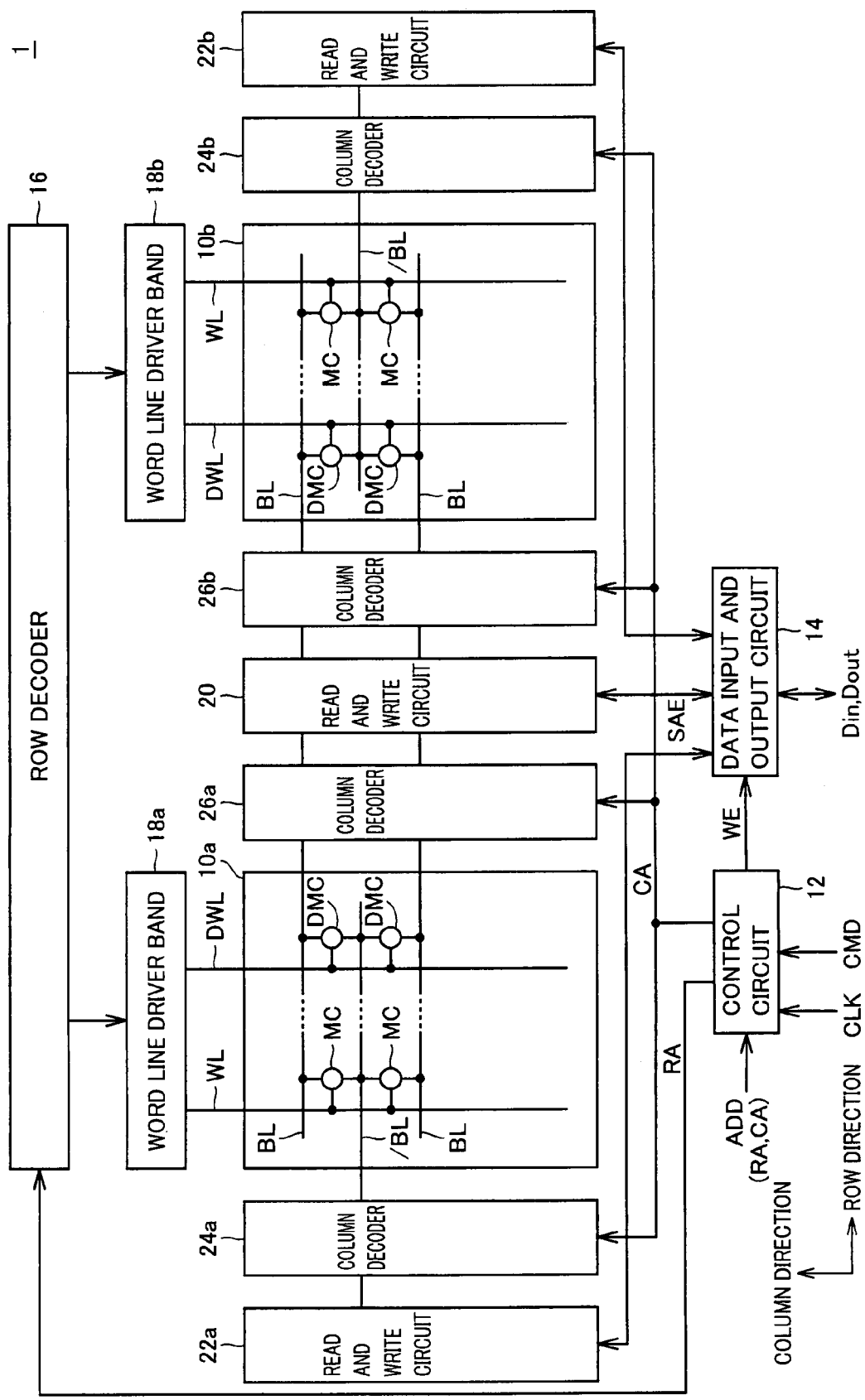
FIG. 1 shows an entire configuration of an MRAM device that is a typical example of the nonvolatile memory device, according to a first embodiment of the present invention.

Embodiments of the present invention are hereinafter described in detail in connection with the drawings. In the drawings, like or corresponding components are denoted by like reference characters and a description thereof is not repeated.

First Embodiment

FIG. 1 shows an entire configuration of an MRAM device 1 that is a typical example of the nonvolatile memory device, according to a first embodiment of the present invention.

Referring to FIG. 1, in response to externally supplied control signal CMD and address signal ADD, MRAM device 1 makes random access to write input data Din and read output data Dout. The data write operation and the data read operation of MRAM device 1 are performed, for example, at a timing synchronized with externally supplied clock signal CLK. The operation timing may be set internally without receiving clock signal CLK which is externally supplied.

MRAM device 1 includes a control circuit 12, memory arrays 10a, 10b, a row decoder 16, word line driver bands 18a, 18b, column decoders 24a, 24b, 26a, 26b, a data input and output circuit 14, and read and write circuits 20, 22a, 22b.

Control circuit 12 controls the whole operation of MRAM device 1 in response to externally supplied control signal CMD and address signal ADD.

Memory arrays 10a and 10b include MTJ memory cells (also simply referred to as memory cells hereinafter) MC arranged in a matrix of respective rows and columns as well as dummy memory cells DMC arranged in respective corresponding columns. In the following, memory arrays 10a and 10b are also collectively referred to as memory array 10, and the rows and columns of the matrix in which memory cells MC are arranged in each memory array 10 are also referred to as memory cell rows and memory cell columns respectively. Although FIG. 1 shows MRAM device 1 configured with a pair of memory arrays 10a and 10b, the MRAM device is not limited to this form and may further include a plurality of pairs of memory arrays 10.

Memory array 10 includes a plurality of word lines WL arranged correspondingly to respective memory cell rows, a plurality of pairs of bit lines BL, /BL arranged correspondingly to respective memory cell columns, and one dummy word line DWL disposed correspondingly to dummy memory cells DMC. In order that bit line /BL may be complementary to each of two adjacent bit lines BL, one bit line /BL is disposed commonly to two bit lines BL.

FIG. 1 shows, in memory arrays 10a and 10b each, two memory cells MC as representative ones, two bit lines BL provided correspondingly to the memory cell columns of these two memory cells MC and coupled to opposing ends of respective two memory cells MC, and one bit line /BL coupled commonly to the connection point of these two memory cells MC. Further, FIG. 1 shows two dummy memory cells DMC provided correspondingly to respective memory cell rows of two memory cells MC and dummy word line DWL coupled commonly to the two dummy memory cells, shown as representative ones. Other memory arrays 10 have the configuration similar to the above-described one, and the detailed description thereof is not repeated.

In the following, where the word lines, bit line pairs, bit lines and dummy word lines are collectively referred to, they are denoted by respective characters WL, BL, /BL, BL (or/BL) and DWL. Where a specific word line, a specific bit line, a specific dummy word line are referred to, they are denoted by respective characters to which some letters/numerals are added, for example, WL1a, BL1 (or /BL1-2) and DWL1a.

Further, binary states such as a high-voltage state and a low-voltage state of a signal, a signal line and data for example are also referred to as "H" level and "L" level respectively.

Row decoder 16 selects, from memory array 10, a row from/to which data is to be read/written, based on row address RA of address signal ADD, and gives a command to word line driver bands 18a, 18b.

Word line driver bands 18a, 18b are each coupled to a plurality of word lines WL and one dummy word line DWL and, based on the command from row decoder 16, selectively activate word line WL and dummy word line DWL.

Column decoders 24a, 24b, 26a, 26b each select, from memory array 10, a column to be accessed, based on column address CA of address signal ADD.

Data input/output circuit 14 controls data input/output of input data Din and output data Dout and, in response to a command from control circuit 12, transmits data to an internal circuit or outputs data from an internal circuit to any external component.

In the first embodiment of the present invention, bit lines BL and /BL implement "first and second current supply lines" and control circuit 12, read and write circuits 20, 22a, 22b, column decoders 24a, 24b and 26a, 26b, row decoder 16, and word line driver bands 18a, 18b implement "data write and read circuit."

Figure 2:
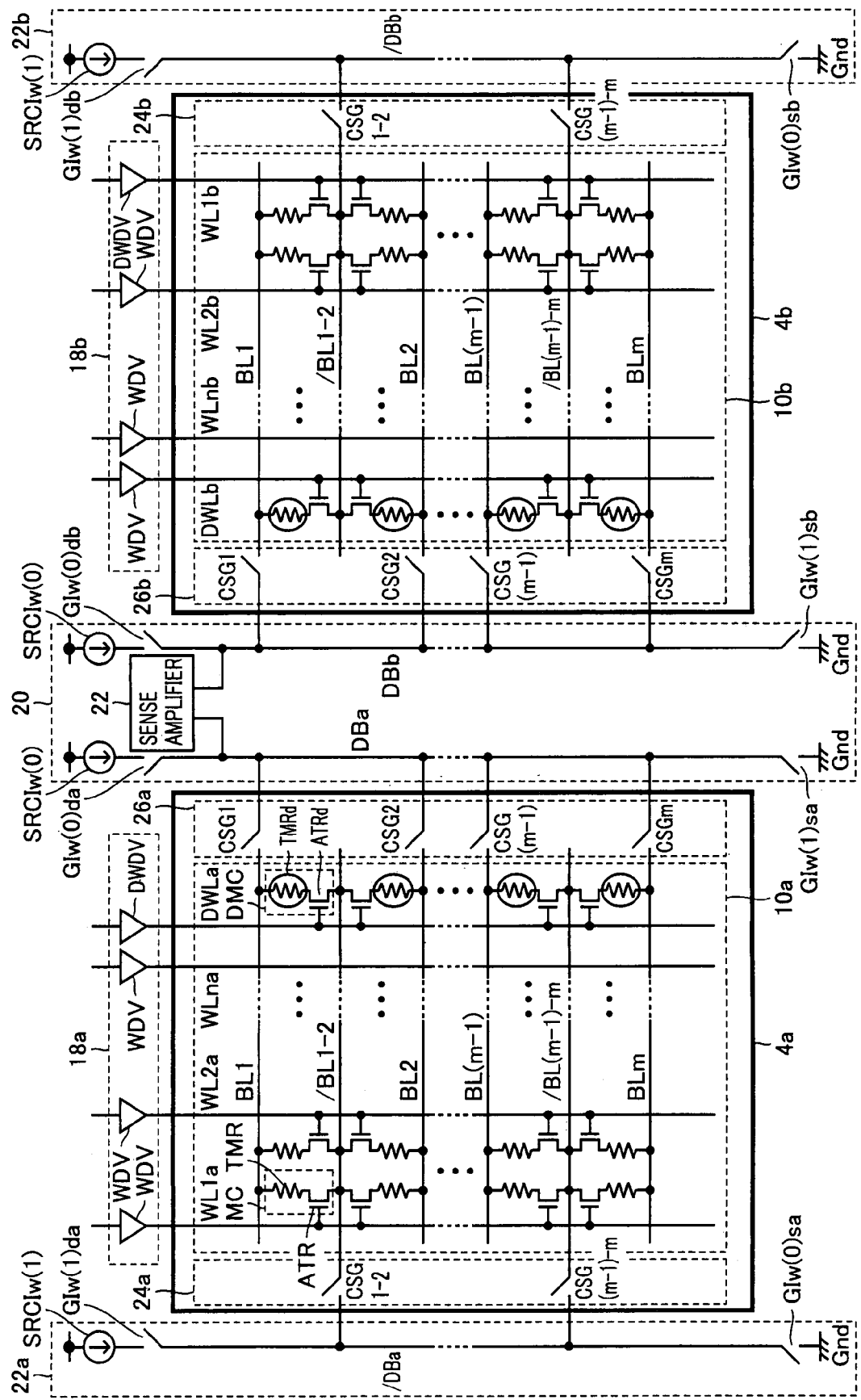
FIG. 2 schematically shows a configuration of memory arrays and their peripheral circuitry according to the first embodiment of the present invention.

Referring to FIG. 2, memory arrays 10a, 10b each include a plurality of memory cells MC arranged in a matrix of n×m (n, m: even natural number). Memory cells MC are each coupled to word line WL and paired bit lines BL, /BL. Word lines WL are provided in respective corresponding memory cell rows and arranged along the column direction. Pairs of bit lines BL, /BL are provided in respective corresponding memory cell columns and arranged along the row direction.

In other words, in the whole memory array 10a, word lines WL1a to WLna, bit lines BL1 to BLm, and bit lines /BL1-2 to /BL (m−1)-m are arranged. In the whole memory array 10b, word lines WL1b to WLnb, bit lines BL1 to BLm, and bit lines /BL1-2 to /BL (m−1)-m are arranged.

Memory cell MC includes a tunneling magneto-resistance element TMR and an access transistor ATR connected in series with tunneling magneto-resistance element TMR.

Tunneling magneto-resistance element TMR operates as a magnetic storage unit having its electric resistance value changed according to the level of storage data. Specifically, tunneling magneto-resistance element TMR is magnetized in one of two magnetization-direction patterns to change its electric resistance value to a high resistance state (maximum resistance value) Rmax or a low resistance state (minimum resistance value) Rmin.

Access transistor ATR electrically couples, in response to activation of its corresponding word line WL, the opposing ends of tunneling magneto-resistance element TMR to bit line BL and bit line /BL respectively. As access transistor ATR, typically a MOS transistor that is a field-effect transistor formed on a semiconductor substrate is employed.

Memory array 10 further includes a plurality of dummy memory cells DMC arranged in respective corresponding columns in a matrix of l×m. Dummy memory cells DMC are each coupled to dummy word line DWL and paired bit lines BL, /BL.

Dummy memory cell DMC includes a dummy resistance element TMRd and a dummy access transistor ATRd connected in series with dummy resistance element TMRd. Dummy resistance element TMRd has its electric resistance value Rd that is set to an intermediate value between electric resistance values Rmax and Rmin corresponding respectively to storage data levels "1" and "0" of memory cell MC, namely set to meet the relation: Rmax>Rd>Rmin. Like access transistor ATR of memory cell MC, dummy access transistor ATRd is typically configured as a field-effect transistor.

Word line driver bands 18a, 18b include a plurality of word line drivers WDV coupled to respective corresponding word lines WL, and a dummy word line driver DWDV coupled to dummy word line DWL. When data is to be written and data is to be read, word line driver bands 18a, 18b activate a selected word line WL or dummy word line DWL to H level according to a row select command from row decoder 16.

Column decoders 26a, 26b include column select gates CSG1 to CSGm arranged between bit lines BL1 to BLm and data lines DBa, DBb and electrically connect/disconnect bit lines BL1 to BLm and data lines DBa, DBb. In the following, data lines DBa, DBb and column select gates CSG1 to CSGm are also simply referred to collectively as data line DB and column select gate CSG, respectively.

According to column address CA from control circuit 12 (FIG. 1), column decoders 26a, 26b activate column select gate CSG corresponding to a selected memory cell column to the select state (H level) and electrically couple the corresponding bit line BL to data line DB.

Column decoders 24a, 24b include column select gates CSG1-2 to CSG (m−1)-m arranged between data lines /DBa, /DBb that are complementary to data lines DBa, DBb and bit lines /BL1-2 to /BL (m−1)-m, and electrically connect/disconnect bit lines /BL1-2 to /BL (m−1)-m and data lines /DBa, /DBb. Like column decoders 26a, 26b, column decoders 24a, 24b activate, according to column address CA from control circuit 12, a column select gate CSG corresponding to a selected memory cell column to the select state (H level) and electrically couple the corresponding bit line /BL to data line /DB.

In the following, memory arrays 10a, 10b, column decoders 24a, 24b and column decoders 26a, 26b are also referred to collectively as memory mats 4a, 4b respectively. Here, memory mats 4a and 4b are arranged symmetrically relative to read and write circuit 20.

Read and write circuits 22a, 22b include "1" write current source SRCIw (1), "1" write gates GIw (1) da, GIw (1) db, and "0" write gates GIw (0) sa, GIw (0) sb.

"1" write current source SRCIw (1) supplies write current Iw (1) for writing "1" data to a selected memory cell MC. "1" write gates GIw (1) da, GIw (1) db are disposed between "1" write current source SRCIw (1) and data lines /DBa, /DBb and electrically couple "1" write current source SRCIw (1) and data lines /DBa, /DBb according to a command from control circuit 12. Then, the data write current supplied from "1" write current source SRCIw (1) is supplied via data line /DB to the selected memory cell MC.

"0" write gates GIw (0) sa, GIw (0) sb are disposed between data lines /DBa, /DBb and reference potential Gnd and electrically couple data lines /DBa, /DBb and reference potential Gnd according to a command from control circuit 12. Then, "0" data current Iw (0) supplied to the selected memory cell MC flows via data line /DB to reference potential Gnd.

When data is to be read from a selected memory cell MC, "0" write gates GIw (0) sa, GIw (0) sb electrically couple data lines /DBa, /DBb and reference potential Gnd. Accordingly, via the selected memory cell MC, an electric current path is formed from read and write circuit 20 to reference potential Gnd to allow the electric resistance value of memory cell MC to be measured.

Read and write circuit 20 includes two "0" write current sources SRCIw (0), "0" write gates GIw (0) da, GIw (0) db and "1" write gates GIw (1) sa, GIw (1) sb.

"0" write current source SRCIw (0) supplies "0" data write current Iw (0) for writing "0" data to a selected memory cell MC. "0" write gates GIw (0) da, GIw (0) db are disposed between "0" write current sources SRCIw (0) and data lines DBa, DBb and electrically couple "0" write current sources SRCIw (0) and data lines DBa, DBb according to a command from control circuit 12.

"1" write gates GIw (1) sa, GIw (1) sb are disposed between data lines DBa, DBb and reference potential Gnd and electrically couple data lines DBa, DBb and reference potential Gnd according to a command from control circuit 12.

In the following, "0" write gates GIw (0) sa, GIw (0) sb, GIw (0) da, GIw (0) db and "1" write gates GIw (1) sa, GIw (1) sb, GIw (1) da, GIw (1) db are also referred to collectively and simply as "0" write gate GIw (Q) and "1" write gate GIw (1), respectively.

A sense amplifier 22 supplies, in response to sense amplifier enable SAE from data input and output circuit 14 (FIG. 1), a read current to a selected memory cell MC and a dummy memory cell DMC that is disposed in the selected column in memory array 10 which is one of paired memory arrays where the selected memory cell is disposed in the other memory array. Sense amplifier 22 compares respective voltages generated at this time to determine which voltage is higher. Specifically, sense amplifier 22 compares the electric resistance value of the selected memory cell MC with the electric resistance value of the dummy memory cell DMC to read data stored in the selected memory cell MC.

As described hereinlater, row decoder 16 (FIG. 1), column decoders 24a, 24b and read and write circuits 20, 22a, 22b cooperate with each other in writing data and reading data to allow the read current for a selected memory cell MC to have a predetermined time width and a predetermined electric-current value and thereby suppress the accidental data write, namely read disturb.

(Memory Cell Structure)

Figure 3:
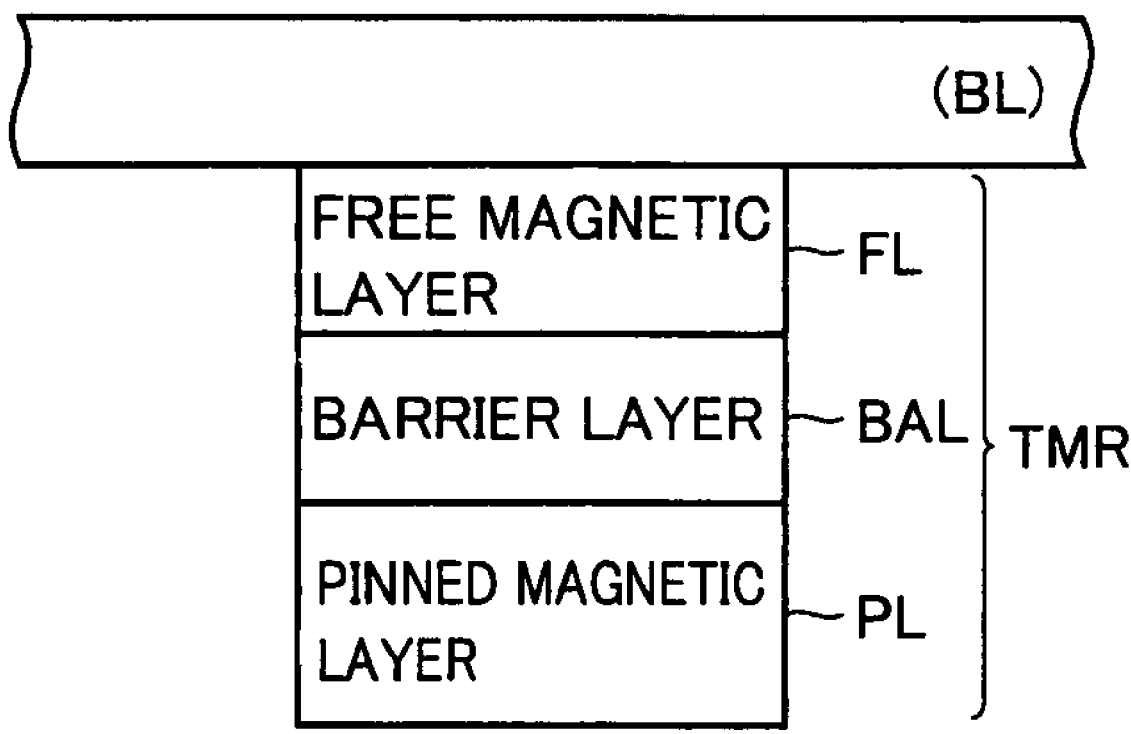
FIG. 3 conceptually illustrates a memory cell according to the first embodiment of the present invention.

Referring to FIG. 3, tunneling magneto-resistance element TMR includes a pinned magnetic layer PL that is a ferromagnet having a certain fixed direction of magnetization, a free magnetic layer FL that is a ferromagnet having the direction of magnetization reversed by an electric current flown through the element, and a barrier layer BAL that is an electrically insulating film formed to generate the tunnel effect between pinned magnetic layer PL and free magnetic layer FL.

Free magnetic layer FL is switched according to the level of written data. Specifically, according to the direction in which the write current flows, the free magnetic layer is magnetized in the direction identical (parallel) to or opposite (antiparallel) to that of pinned magnetic layer PL. These pinned magnetic layer PL, barrier layer BAL and free magnetic layer FL form a magnetic tunnel junction (MTJ).

Free magnetic layer FL is formed of a ferromagnet made of a metal material containing Co, Fe, Ni for example as its main component, such as CoFe alloy, Co, Fe, CoNi alloy and CoFeNi alloy and containing B (boron) added to the metal material. Barrier layer BAL is formed of an insulating material generating the tunnel effect, such as AlOx and MgO.

Pinned magnetic layer PL has, for example, a multilayer structure comprised of a ferromagnet similar to that of free magnetic layer FL and a semi-ferromagnet such as PtMn, FeMn, IrMn. With such a multilayer structure, the spinning direction of the ferromagnet is fixed and accordingly the direction of magnetization of the whole pinned magnetic layer PL is fixed.

The electric resistance value of tunneling magnet-resistance element TMR is changed according to the relative relation of magnetization direction between pinned magnetic layer PL and free magnetic layer FL. Specifically, the electric resistance of tunneling magneto-resistance element TMR has the low resistance state Rmin when the magnetization direction of free magnetic layer FL and the magnetization direction of pinned magnetic layer PL are identical (parallel) to each other, and has the high resistance state Rmax when respective directions of magnetization are opposite (antiparallel) to each other.

(Data Read Operation)

When data stored in a selected memory cell MC is to be read, sense amplifier 22 is used to compare the electric resistance value of the selected memory cell MC in the selected column of one of paired memory arrays 10 and that of a dummy memory cell DMC in the other memory array that is located in the same column as the selected column.

Referring again to FIG. 2, it is supposed for example that data in memory cell MC located in the first column and the first row of memory array 10a is to be read. Then, in memory mat 4a first, column decoder 26a sets column select gate CSG1 to the selected state, column decoder 24a sets column select gate CSG1-2 to the selected state and word line driver band 18a activates word line WL1a to H level. In memory mat 4b, column decoder 26b sets column select gate CSG1 to the selected state, column decoder 24b sets column selected gate CSG1-2 to the selected state and word line driver band 18b activates dummy word line DWLb to H level.

Accordingly, with respect to sense amplifier 22, an electric current path is formed in memory mat 4a through which the electric current flows via selected memory cell MC to reference potential Gnd while an electric current path is formed in memory mat 4b through which the electric current flows to reference potential Gnd via dummy memory cell DMC located in the same memory cell column as selected memory cell MC. For any of memory cells MC that is selected, the length of the electric current path (path length) is substantially the same. Therefore, even in the case where the number of constituent memory cells MC is large, variation of the voltage value due to variation of the read current can be suppressed and thus stable data reading can be performed. In the following, the read operation is described in more detail.

Figure 4:
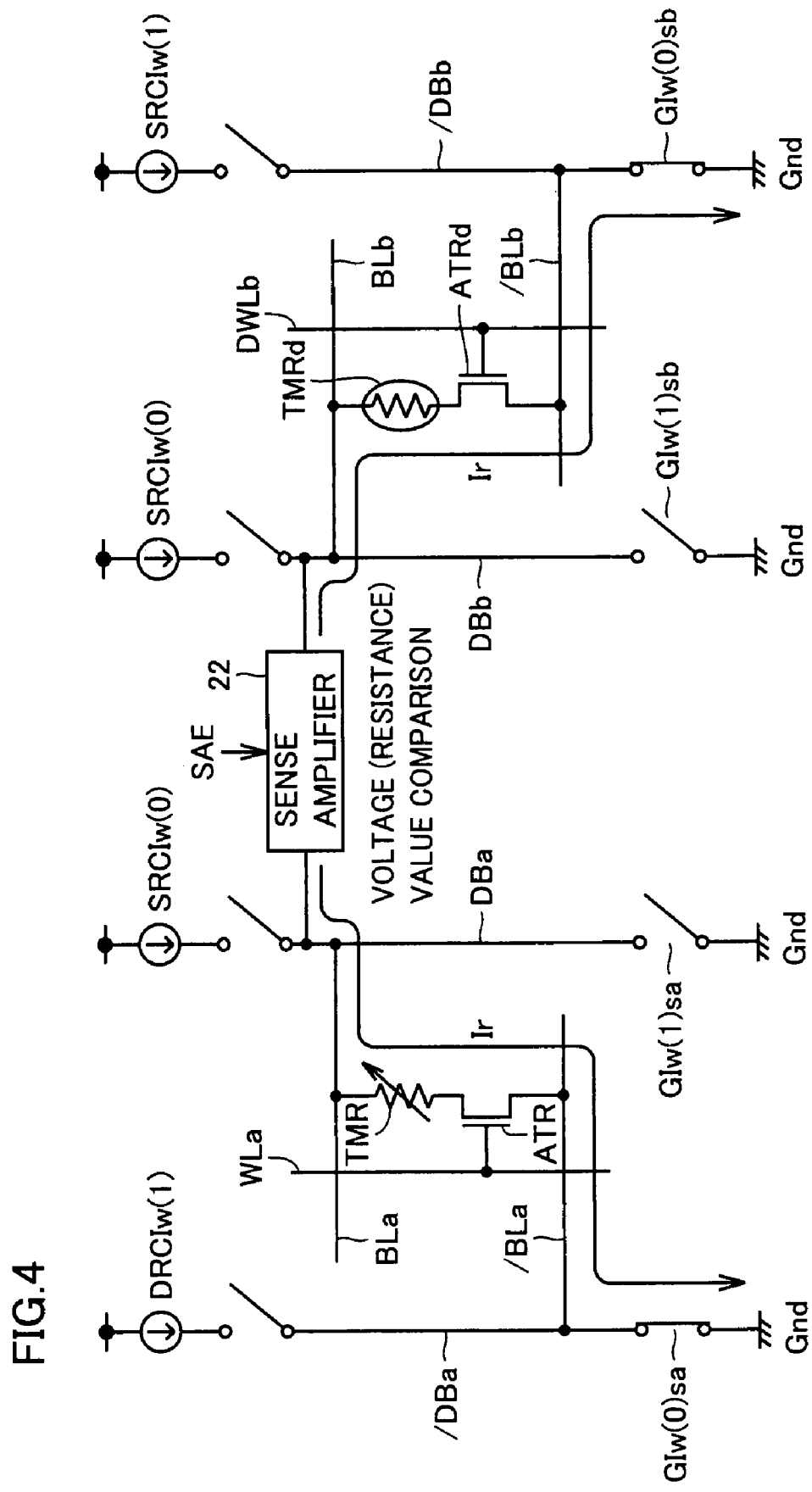
FIG. 4 shows circuit connections when data is read from a memory cell according to the first embodiment of the present invention.

Referring to FIG. 4, when data is to be read from memory cell MC disposed in memory mat 4a, column decoders 24a, 24b, 26a, 26b (FIG. 2) electrically couple paired bit lines BL, /BL and data lines DB, /DB to which the selected memory cell MC and its corresponding dummy memory cell DMC are connected respectively. Row decoder 16 (FIG. 1) activates word line driver bands. 18a, 18b to activate word line WLa and dummy word line DWLb to H level. Then, access transistor ATR of memory cell MC and dummy access transistor ATRd of dummy memory cell DMC are turned on. Further, read and write circuits 22a, 22b set "0" write gates GIw (0) sa, GIw (0) sb to the electrically conductive state.

Receiving sense amplifier enable SAE, sense amplifier 22 supplies substantially identical data read currents Ir to memory mats 4a, 4b respectively via data lines DBa, DBb. Then, read current Ir supplied from sense amplifier 22 to data line DBa flows through the current path to reference potential Gnd, through bit line BL, tunneling magneto-resistance element TMR, access transistor ATR, bit line /BL and data line /DBa in this order. Read current Ir supplied from sense amplifier 22 to data line DBb flows through the current path to reference potential Grid, through bit line BL, dummy resistance element TMRd, dummy access transistor ATRd, bit line /BL and data line /DBb in this order.

Thus, sense amplifier 22 compares respective voltage values depending on respective electric resistance values generated in the paths of memory mats 4a, 4b to detect whether tunneling magneto-resistance element TMR has the high resistance state Rmax or the low resistance state Rmin.

When sense amplifier 22 compares the voltage values, there is a detection delay such as first-order lag. For this reason, preferably the difference between the voltage values is larger in order that the detection delay of sense amplifier 22 may be suppressed. For this reason, the read current supplied by the sense amplifier 22 is preferably as large as possible.

However, if the read current supplied by the sense amplifier 22 is larger, an accidental data write could be more likely to occur. Therefore, row decoder 16, column decoders 24a, 24b and read and write circuits 20, 22a, 22b optimize the time for which the read current is supplied and the value of the current in order that the detection delay time of sense amplifier 22 and the probability of occurrences of data write error may be suppressed.

The above description is given regarding the operation of reading data from memory cell MC disposed in memory mat 4a. For memory mat 4b as well, the data can be read similarly.

(Data Write Operation)

Figure 5A:
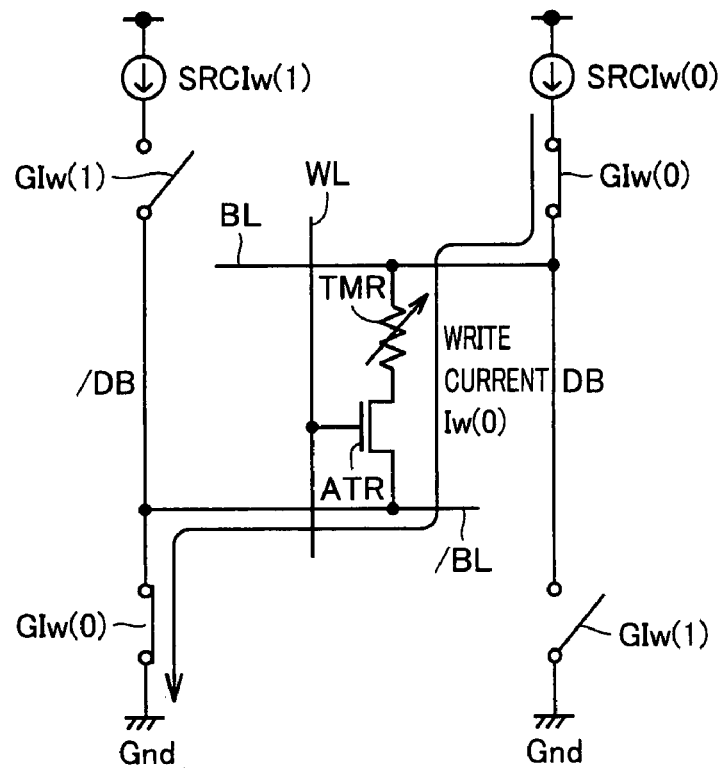
FIGS. 5A and 5B illustrate writing of data to a memory cell according to the first embodiment of the present invention.

FIG. 5A shows circuit connection when "0" data is written to memory cell MC.

Figure 5B:
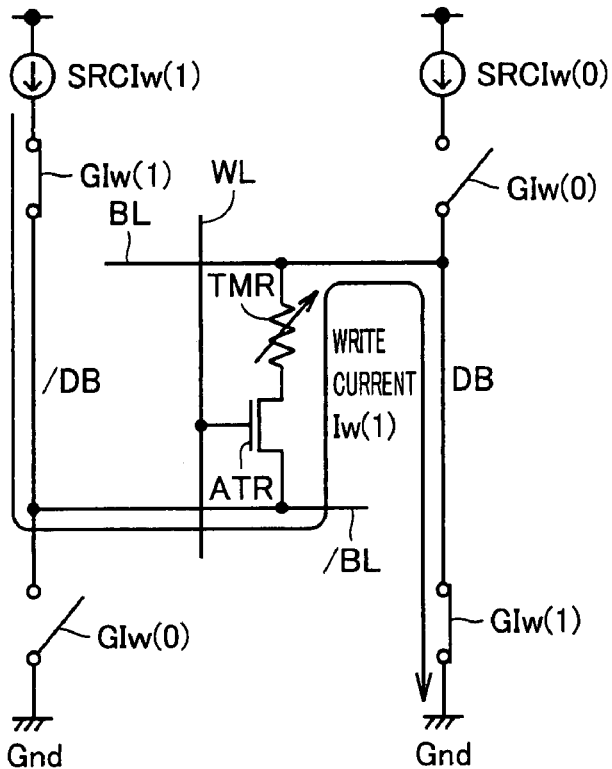

FIG. 5B shows circuit connection when "1" data is written to memory cell MC.

Referring to FIG. 5A, when "0" data is to be written to memory cell MC, read and write circuits 20 and 22a, 22b turn on respective "0" write gates GIw (1) and turn off respective "1" write gates GIw (0). Accordingly, write current Iw (0) supplied from "0" data write current source SRCIw (0) flows to reference potential Grid through the path including "0" write gate GIw (0), data line DB, bit line BL, tunneling magneto-resistance element TMR, access transistor ATR, bit line /BL, data line /DB and "0" write gate GIw (0). Therefore, through tunneling magneto-resistance element TMR, the write current flows in the direction from bit line BL to bit line /BL, namely in the direction from free magnetic layer FL to pinned magnetic layer PL.

In contrast, referring to FIG. 5B, when "1" data is to be written to memory cell MC, read and write circuits 20 and 22a, 22b turn on respective "1" write gates GIw (1) and turn off respective "0" write gates GIw (1). Accordingly, write current Iw (1) supplied from "1" data write current source SRCIw (1) flows to reference potential Gnd through the path including "1" write gate GIw (1), data line /DB, bit line /BL, access transistor ATR, tunneling magneto-resistance element TMR, bit line BL, data line DB and "1" write gate GIw (0). Therefore, through tunneling magneto-resistance element TMR, the write current flows in the direction from bit line /BL to bit line BL, namely the direction from pinned magnetic layer PL to free magnetic layer FL.

Figure 6A:
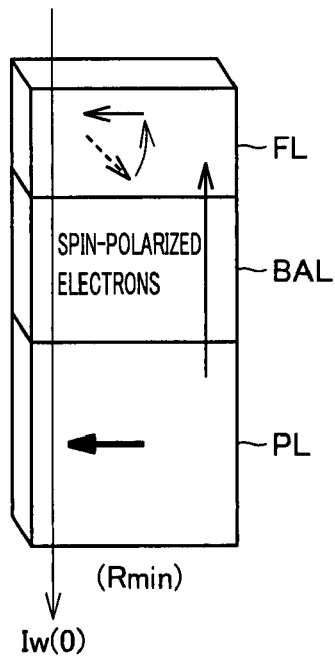
FIGS. 6A and 6B illustrate reversal of the magnetization direction of a memory cell according to the first embodiment of the present invention.

FIG. 6A shows the case where the write current flows in the direction from free magnetic layer FL to pinned magnetic layer PL.

Figure 6B:
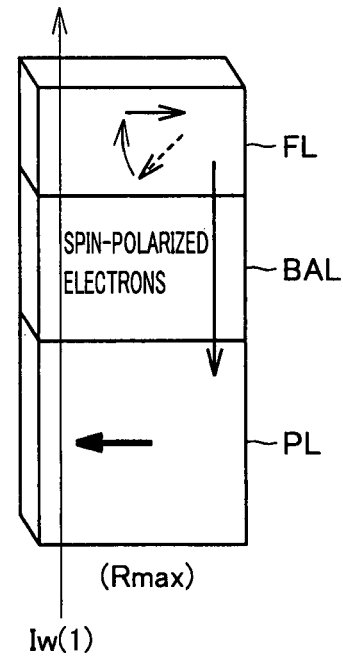

FIG. 6B shows the case where the write current flows in the direction from pinned magnetic layer PL to free magnetic layer FL.

Referring to FIG. 6A, it is shown that the magnetization of free magnetic layer FL changes from the rightward direction to the leftward direction as seen in FIG. 6A. In this case, write current Iw (0) flows in the direction from free magnetic layer FL to pinned magnetic layer PL. Therefore, electrons move from pinned magnetic layer PL to free magnetic layer FL and accordingly spin-polarized electrons polarized in the same direction as the electron spin direction of pinned magnetic layer PL are injected from pinned magnetic layer PL to free magnetic layer FL. Then, free magnetic layer FL is subjected to the torque in the direction of polarization of the injected spin-polarized electrons to have its electron spin direction changed. Finally, the direction of magnetization of free magnetic layer FL is identical to, namely parallel to that of pinned magnetic layer PL.

Referring to FIG. 6B, it is shown that the magnetization of free magnetic layer FL changes from the leftward direction to the rightward direction as seen in FIG. 6B. In this case, the write current flows in the direction from pinned magnetic layer PL to free magnetic layer FL. Therefore, electrons move from free magnetic layer FL to pinned magnetic layer PL and accordingly, from free magnetic layer FL, only spin-polarized electrons polarized in the same direction as the electron spin direction of pinned magnetic layer PL move. Thus, in free magnetic layer FL, the amount of stored spin-polarized electrons polarized in the direction opposite to the electron spin direction of pinned magnetic layer PL becomes relatively larger. Finally, the direction of magnetization of free magnetic layer FL is opposite to, namely antiparallel to pinned magnetic layer PL.

(Data Write Characteristics)

Figure 7:
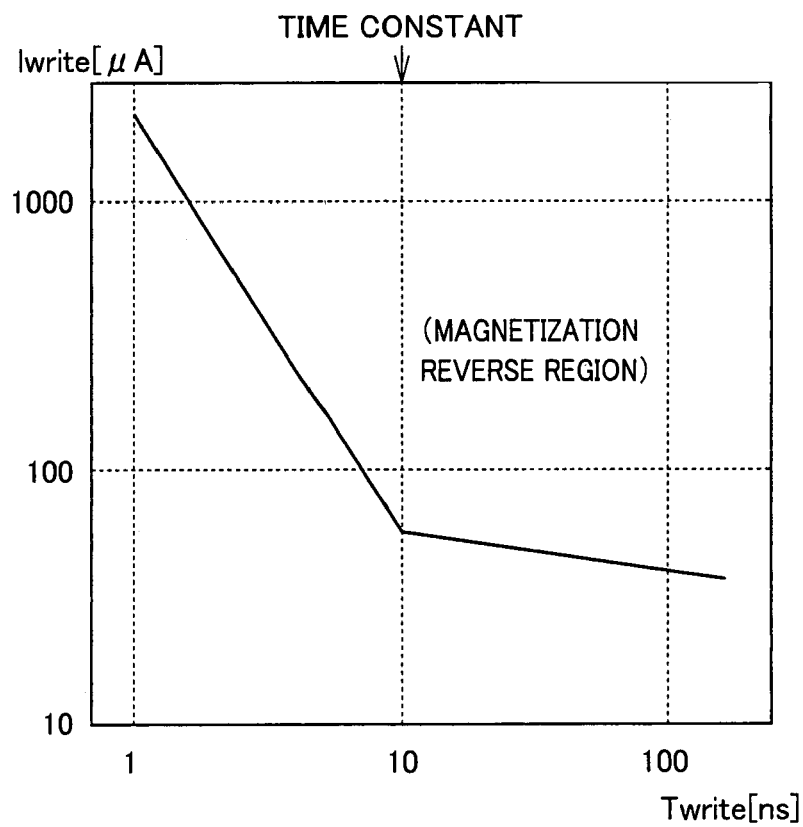
FIG. 7 is a graph showing a relation between the electric-current value of a write current and the current supply duration causing magnetization reversal in a tunneling magneto-resistance element.

FIG. 7 shows a relation between the electric current value of the write current and the supply duration thereof that cause reversal of magnetization in tunneling magneto-resistance element TMR. In the graph shown in FIG. 7, the upper region relative to the solid line is the region where the magnetization reversal occurs.

Referring to FIG. 7, it is seen that electric current value Iwrite of the write current monotonously decreases with respect to supply duration Twrite. This is for the reason that the write current passes through tunneling magneto-resistance element TMR and accordingly thermal energy is generated due to the resistance loss and, as a result, the temperature is increased by the thermal energy, the direction of magnetization of free magnetic layer FL in tunneling magneto-resistance element TMR becomes unstable and accordingly reversal of magnetization is caused by a smaller write current. This phenomenon is called "thermal assist effect."

In particular, it is seen that, when supply duration Twrite is shorter than a predetermined time, there is a turning point at which current value Iwrite required for magnetization reversal suddenly increases (in FIG. 7, this point is found at the supply duration of 10 [ns]). The reason therefor is considered that the thermal energy which is generated due to the write current in tunneling magneto-resistance element TMR is not sufficiently generated in a short period of time, and thus the temperature increase of tunneling magneto-resistive element TMR is suppressed. Further, it may simply be considered that the energy necessary for switching by the thermal energy is not supplied. Here, the supply duration at such a turning point as described above is defined as a time constant of the temperature increase.

(Optimization of Read and Write Currents)

Figure 8:
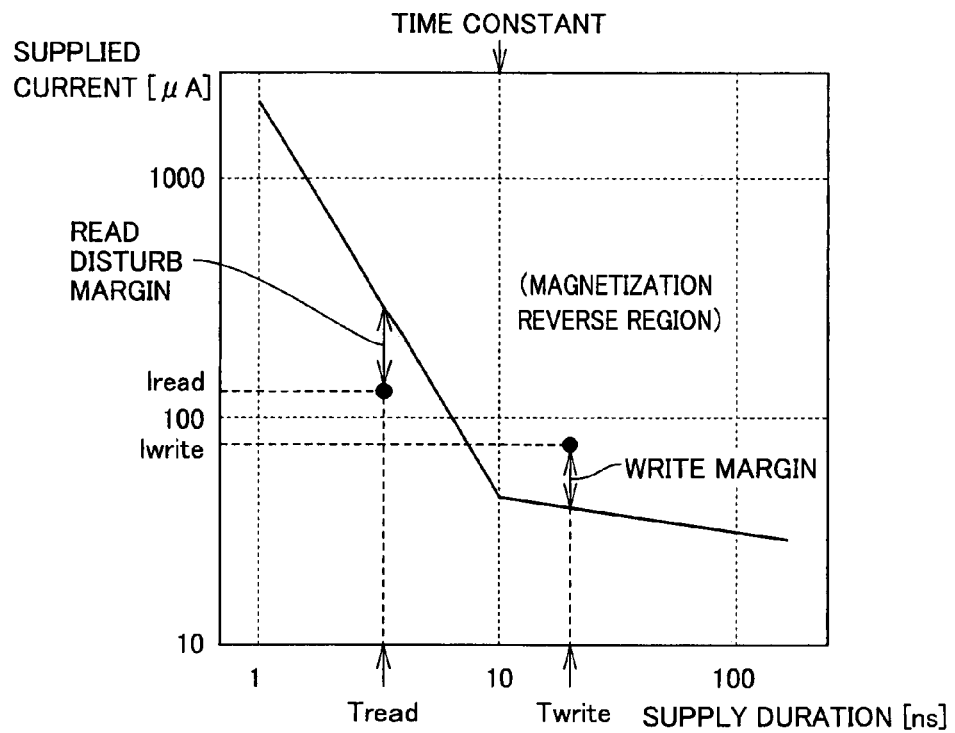
FIG. 8 illustrates optimization of a read current and a write current.

Referring to FIG. 8, when data is to be read, it is necessary to select a read curent having a sufficient margin (read disturb margin) in the downward direction as seen in FIG. 8 with respect to the magnetization reversal characteristic, in order to avoid magnetization reversal in tunneling magneto-resistance element TMR. When data is to be written, it is necessary to select a write current having a sufficient margin (write margin) in the upward direction as seen in FIG. 8 with respect to the magnetization reversal characteristic, in order to sufficiently cause the magnetization reversal in tunneling magneto-resistance element TMR.

As described above, between the electric current value and the electric current supply duration that cause the magnetization reversal, there is the relation of monotonous decrease. This means that shortening of the supply duration increases the threshold value of the electric current that causes the magnetization reversal. Therefore, in terms of suppressing occurrence of the read disturb, the current supply duration may be shortened to increase the threshold value of the electric current causing the magnetization reversal, and thereby ensure a sufficient read disturb margin.

Therefore, by providing a shorter read current supply duration relative to the write current supply duration, the read disturb margin can be ensured and occurrence of the read disturb can be suppressed.

Further, in order to increase the detection speed of sense amplifier 22, it is preferable that the read current value is as large as possible. In the case where a large read disturb margin can be ensured by providing the read current supply duration that is relatively and sufficiently shorter than the write current supply duration, the read current value can be made relatively larger, in the range of the ensured read margin, relative to the write current value. Then, the detection speed of sense amplifier 22 can further be increased as compared with the case where the read current value is smaller than or substantially equal to the write current value.

In particular, as described above, the relation between the current value and its supply duration that cause the magnetization reversal has the turning point of reversal which is at the time constant of the temperature increase and at which the current value sharply increases. Therefore, the write current supply duration may be set longer than the time constant of the temperature increase and the read current supply duration may be set shorter than the time constant of the temperature increase. In this way, both of the write margin and the read margin can be sufficiently ensured.

The inventor of the present invention has found that, in the case where the design rule of at most 0.1 [μm] is applied to an MRAM device, namely in the case where a tunneling magneto-resistance element TMR is formed in the area of approximately 0.1×0.2 [μm$^2$], the time constant of the temperature increase is approximately 10 [ns] at room temperature (25° C. for example). Under this condition, it is preferable that the read current supply duration is shorter than 10 [ns]. As seen, the time constant of the temperature increase changes depending on the material for tunneling magneto-resistance element TMR, the ambient temperature and the size (area) of tunneling magneto-resistance element TMR for example. When the ambient temperature changes in the range from room temperature (approximately 25° C. for example) to 120° C. for example, the time constant of the temperature increase changes in the range of approximately 5 to 10 [ns]. As the size of tunneling magneto-resistance element TMR is smaller, the thermal capacity is also smaller. Then, it is considered that the time constant of the temperature increase in this case is also shorter.

(Operation Time Chart)

Figure 9:
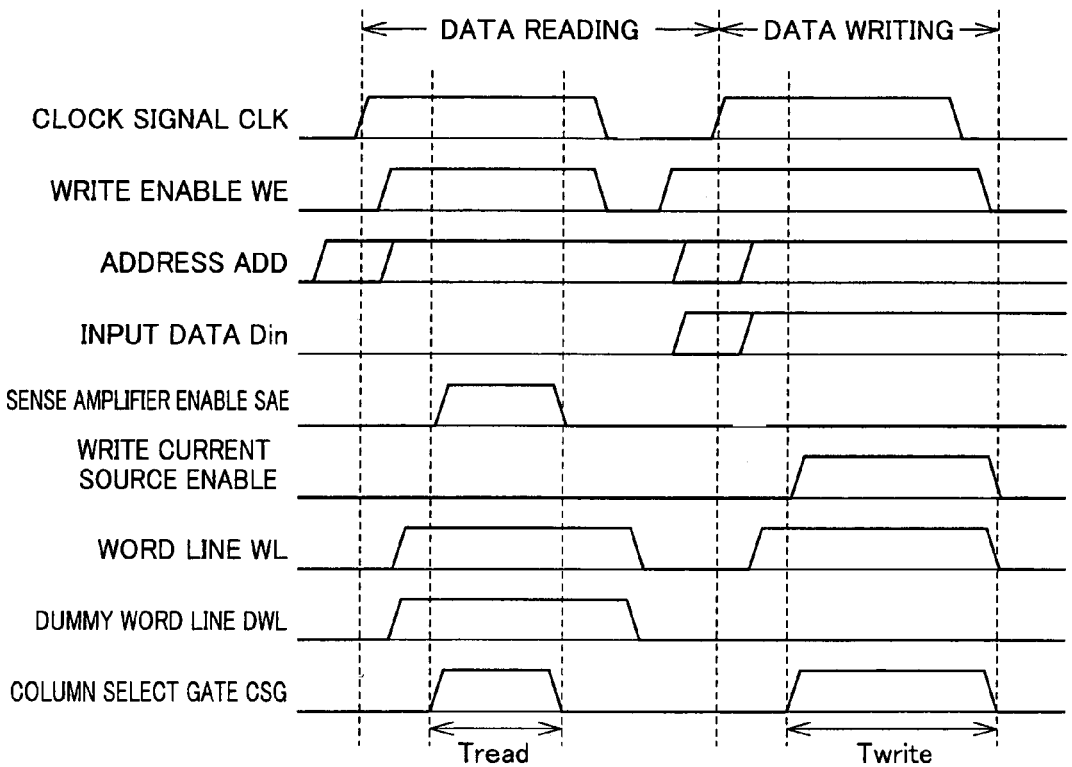
FIG. 9 shows an operation sequence of an MRAM device according to the first embodiment of the present invention.

Referring to FIGS. 1 and 9, control circuit 12 performs data reading or data writing at a timing synchronous to externally supplied clock signal CLK. Control circuit 12 provides sense amplifier enable SAE to read and write circuit 20 to activate sense amplifier 22, provides row address RA to row decoder 16 to activate word line WL and dummy word line DWL, and provides column address CA to column decoders 26a, 26b, 24a, 24b to activate paired bit lines BL, /BL. In this way, data is read from a selected memory cell MC. In other words, when the condition that these are all activated is satisfied, the data reading is performed.

Therefore, as shown in FIG. 9, the activation time width of column select gate CSG in data reading operation is set shortest relative to the activation time width of word line WL and dummy word line DWL for example, and supply duration Tread of the read current is determined according to the time width of column select gate CSG.

In contrast, for column select gate CSG in data writing operation as well, the activation time width of column select gate CSG is set shortest relative to the activation time width of word line WL and dummy word line DWL for example, and the write current supply duration Twrite is determined according to the time width of the column select gate.

The time width of the column select gate in data reading and data writing operations can be designed appropriately to optimize read current supply duration Tread and write current supply duration Twrite.

(Read and Write Circuit)

Figure 10:
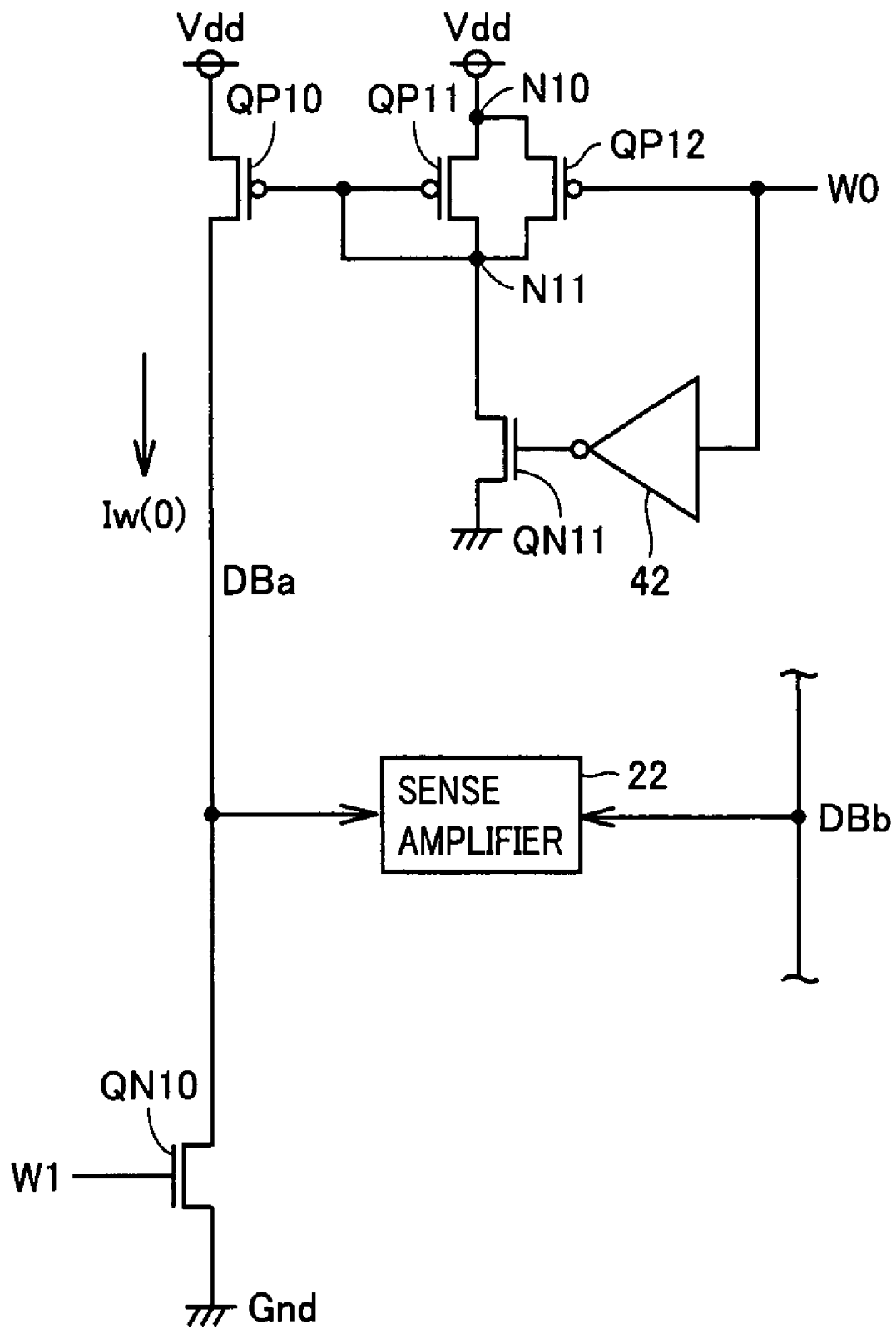
FIG. 10 shows an implementation example of a write current source and a write gate of a read and write circuit.

FIG. 10 shows exemplary implementation of a write current source and a write gate of the read and write circuit.

Referring to FIG. 10, read and write circuit 20 receives from data input and output circuit 14 (FIG. 1) control signal W0 to provide "0" write current Iw (0) to data line DBa and receives control signal WI to provide reference potential Gnd to data line DBa. Read and write circuit 20 includes transistors QP11, QP12, QP10, QN11, QN10 and an inverter 42. Transistor QP11 is disposed between a node N10 supplied with power supply voltage Vdd and a node N11 and has its gate electrically coupled to node N11. Transistor QP12 is disposed between node N10 and node N11 and has its gate receiving control signal W0. Transistor QP10 is disposed between power supply voltage Vdd and data line DBa and has its gate electrically coupled to node N11. Inverter 42 receives control signal W0 to output its inverted signal. Transistor QN11 is disposed between node N11 and reference potential Gnd and has its gate electrically coupled to inverter 42. Transistor QN10 is disposed between data line DBa and reference potential Gnd and has its gate receiving control signal W1.

Read and write circuit 20 further includes sense amplifier 22 electrically coupled to data line DBa. Sense amplifier 22 senses a voltage difference corresponding to a difference between a read current flowing through data line DBa and that through data line DBb.

When data is to be written, read and write circuit 20 receives control signals W0 and W1 from control circuit 12 (FIG. 1). In other words, while transistor QP12 receives control signal W0 activated to "L" to be activated when "0" data is to be written, transistor QN10 receives control signal W1 activated to "H" to be activated when "1" data is to be written. Thus, read and write circuit 20 is activated as control signal W0 or W1 is input.

Here, transistors QP10 to QP12 are for example P-channel MOS transistors. Transistors QN10, QN11 are for example N-channel MOS transistors. In write and read circuit 20 according to the first embodiment of the present invention, respective transistor sizes of transistors QP10 to QP12 are equal to each other and respective transistor sizes of transistors QN10, QN11 are equal to each other.

Thus, transistors QP10 and QP11 form a current mirror circuit and supply identical operating currents (mirror currents) respectively. According to the description above, transistors are equal to each other in transistor size. However, the transistor size may be adjusted in order that respective operating current amounts may be adjusted. Specifically, an operating current can be supplied according to the ratio between respective transistor sizes of the transistors constituting the current mirror circuit, which is applied as well to the following description.

Transistor QP10 supplies, to data line DBa, the same current as the current flowing through node N11. Transistors QP12 and QN11 are disposed between power supply voltage Vdd and reference potential Gnd, receive control signal W0 activated to "L" and are both turned on. Accordingly, via transistors QP12 and QN11, a through current flows from power supply voltage Vdd to reference potential Gnd. Then, transistor QP10 supplies to data line DBa "0" write current that is identical to the through current flowing through node N11.

Further, transistor QN10 is disposed between data line DBa and reference potential Grid, receives control signal W1 activated to "H" and is turned on. Then, transistor QN10 supplies reference potential Gnd to data line DBa.

Thus, read and write circuit 20 can supply the write current or reference potential Grid to data line DBa in response to control signal W0 or W1.

In the following, the circuit configuration included in read and write circuit 20 for supplying the write current or reference potential Gnd to data line DBb as well as the circuit configurations of read and write circuits 22a and 22b are similar to those shown in FIG. 10, and thus the detailed description thereof is not repeated.

Figure 11:
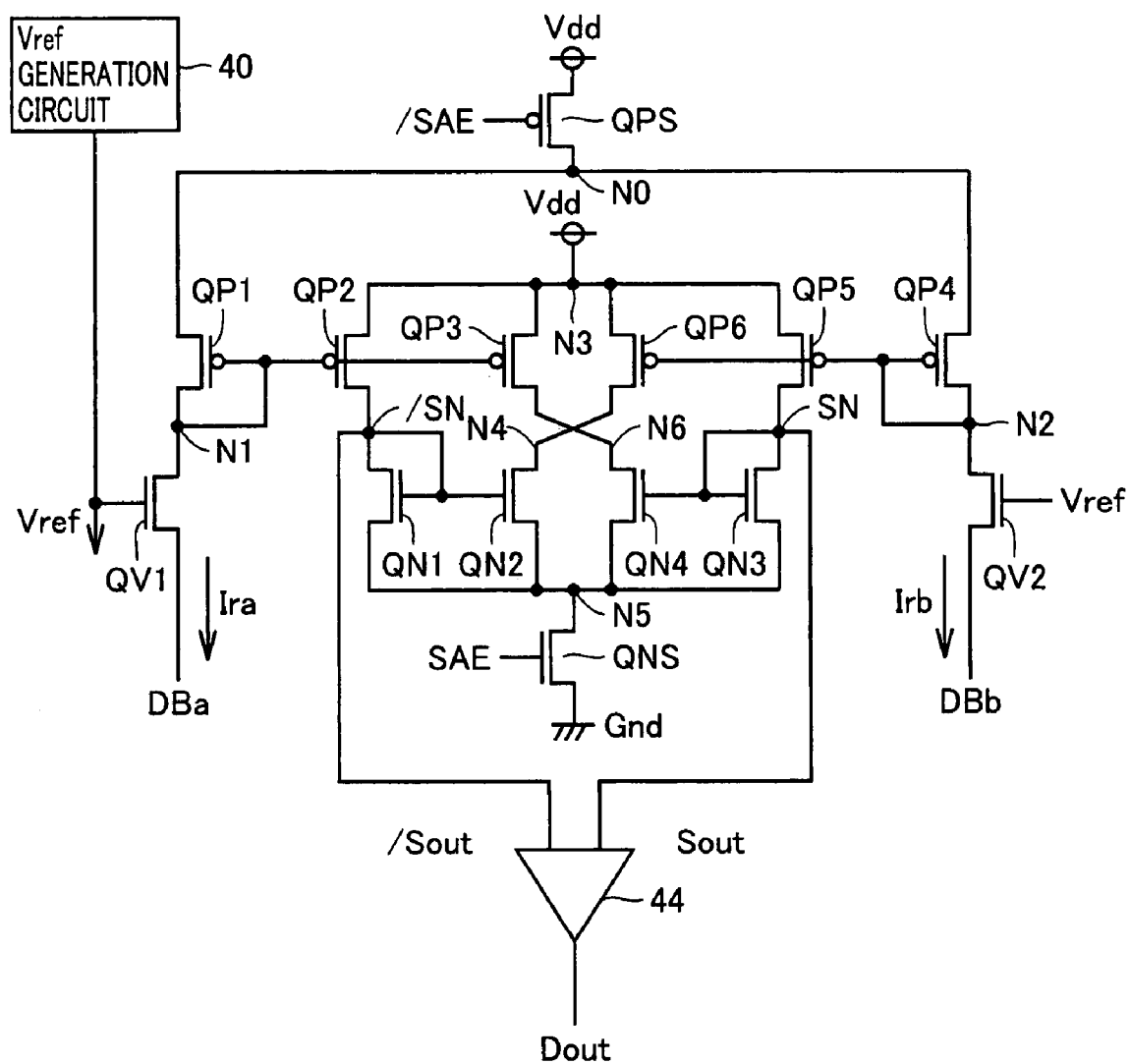
FIG. 11 shows an example of implementation of a sense amplifier of the read and write circuit.

Referring to FIG. 11, sense amplifier 22 keeps data lines DB, /DB at a voltage that is at most a predetermined voltage, and generates a voltage difference according to a difference between a read current flowing through data lines DB and that through /DB, on sense nodes SN and /SN. Sense amplifier 22 includes transistors QPS, QP1 to QP5, QN1 to QN3 and an amplifier 44.

Transistor QPS is disposed between power supply voltage Vdd and a power supply node N0 and has its gate receiving sense amplifier enable /SAE. Transistor QP2 is disposed between a node N3 which receives power supply voltage Vdd and a sense node /SN and has its gate electrically coupled to a node N1. Transistor QP5 is disposed between node N3 and a sense node SN and has its gate electrically coupled to a node N2. Transistor QP1 is disposed between node N0 and node N1 and has its gate electrically coupled to node N1. Transistor QP4 is disposed between node N0 and node N2 and has its gate electrically coupled to node N2. Transistor QP3 is disposed between node N3 and a node N6 and has its gate electrically coupled to node N1. Transistor QP6 is disposed between node N3 and a node N4 and has its gate electrically coupled to node N2. Transistor QN1 is disposed between sense node /SN and a node N5 and has its gate electrically coupled to sense node /SN. Transistor QN2 is disposed between node N4 and node N5 and has its gate electrically coupled to sense node /SN. Transistor QN3 is disposed between sense node SN and node N5 and has its gate electrically coupled to sense node SN. Transistor QN4 is disposed between node N6 and node N5 and has its gate electrically coupled to sense node SN.

Amplifier 44 is connected to sense nodes SN and /SN, further amplifies the difference between sense outputs Sout and /Sout transmitted to sense nodes SN and /SN and outputs output data Dout.

Further, sense amplifier 22 includes transistors QV1, QV2. Transistor QV1 is disposed between node N1 and data line DBa and has its gate receiving input of reference voltage Vref generated by Vref generation circuit 40. Transistor QV2 is disposed between node N2 and data line DBb and has its gate receiving input of reference voltage Vref. Accordingly, transistors QV1 and QV2 keep data lines DBa, DBb at a voltage of at most a predetermined voltage.

When data is to be read, sense amplifier 22 receives sense amplifier enables SAE, /SAE from control circuit 12 (FIG. 1).

Transistor QPS receives, when data is to be read, input of sense amplifier enable /SAE activated to "L" level while transistor QNS receives, when data is to be read, input of sense amplifier enable SAE activated to "H" level. Thus, as sense amplifier enables SAE, /SAE are input, sense amplifier 22 is activated.

Here, transistors QP1 to QP7 and QPS are for example P-channel MOS transistors. Transistors QN1 to QN4, QNS, QV1 and QV2 are for example N-channel MOS transistors. In sense amplifier 22 according to the first embodiment of the present invention, transistors QP1 to QP7 are identical to each other in transistor size and transistors QN1 to QN4 are identical to each other in transistor size.

Transistors QP1 to QP3 constitute a current mirror circuit and each supply the same operating current (mirror current). Similarly, transistors QP4 to QP6 constitute a current mirror circuit and each supply the same operating current. Transistors QN1 and QN2 constitute a current mirror circuit and supply the same operating current (mirror current). Similarly, transistors QN3 and QN4 constitute a current mirror circuit and supply the same operating current. While it is described above that the transistors have the same transistor size, the transistor size may be adjusted to adjust the amount of each operating current. Specifically, the operating current according to the size ratio between transistors constituting a current mirror circuit can be supplied. This is applied as well to the following description.

Transistor QP2 supplies, to sense node /SN, the same operating current as the operating current flowing through node N1, while transistors QP6, QN1, QN2 supply the same operating current as the operating current flowing from sense node /SN toward node N2.

Transistor QP5 supplies, to sense node SN, the same operating current as the operating current flowing through node N2, while transistors QP3, QN3, QN4 supply the same operating current as the operating current flowing from sense node SN toward node N1.

In the following, sensing operation of sense amplifier 22 is described.

It is supposed for example that read currents Ira and Irb flow in data lines DBa and DBb respectively. Since transistors QP1 to QP3 constitute a current mirror circuit as described above, transistors QP2 and QP3 are to supply, to sense node /SN and node N6 respectively, the same operating current as read curent Ira flowing through transistor QP1. At the same time, transistors QP5 and QP6 are to supply, to sense node SN and node N4 respectively, the same operating current as read current Irb flowing through transistor QP4.

Since transistors QN1 and QN2 also constitute a current mirror circuit as described above, transistor QN1 is to supply the same operating current Irb as transistor QN2 from sense node /SN to node N5 connected to the ground voltage. Further, since transistors QN3 and QN4 also constitute a current mirror circuit, transistor QN4 is to supply the same operating current Ira as transistor QN3 from sense node SN to node N5 connected to reference potential Gnd.

Then, transistor QP5 is to supply operating current Irb to sense node SN, while transistor QN3 is to supply the same operating current Ira as transistor QN4 from sense node SN. Further, transistor QP2 is to supply operating current Ira to sense node /SN while transistor QN1 is to supply the same operating current Irb as transistor QN2 from sense node /SN.

Thus, the current mirror circuit generates the mirror currents according to the read currents flowing respectively through data lines DBa, DBb, and the difference between the generated mirror currents is converted into a voltage difference that is output to sense nodes SN, /SN. For example, in the case where the relation: read currents Ira>Irb is satisfied, respective voltage levels of sense nodes SN and /SN are converted respectively into "L" level and "H" level. In the case where the relation operating currents Irb>Ira is satisfied, respective voltage levels of sense nodes SN and /SN are converted respectively to "H" level and "L" level.

Amplifier 44 further amplifies sense outputs Sout, /Sout that are respective. voltage levels of these sense nodes SN, /SN to generate output data Dout.

In accordance with the first embodiment of the present invention, the control circuit, the read and write circuit, the row decoder and the column decoder adjust the activation time and the activation timing to provide the duration for which the read current is supplied when data is to be read that is shorter than the duration for which the write current is supplied when data is to be written. Therefore, the thermal assist effect on the tunneling magneto-resistance element due to the read current is suppressed, and thus a sufficient read disturb margin for the threshold current value that causes reversal of magnetization can be ensured. Accordingly, accidental data write due to the read current can be suppressed and the nonvolatile memory device that performs stable access operation can be implemented.

Further, in accordance with the first embodiment of the present invention, since a sufficient read disturb margin can be ensured, the electric current value of the read current can be made larger than the electric current value of the write current. Accordingly, the sense delay time of the sense amplifier can be suppressed and the nonvolatile memory device performing high-speed read operation can be implemented.

Furthermore, in accordance with the first embodiment of the present invention, the read and write current supplies the read current and the write current via the common data line to a selected memory cell. Therefore, as compared with a configuration where a read line for transmitting the read current and a write line for transmitting the write current are disposed separately, the present embodiment can reduce the total number of lines and thus the nonvolatile memory device having a smaller chip area can be implemented.

Moreover, in accordance with the first embodiment of the present invention, when any memory cell is selected, the read current, "0" write current and "1" write current all flow through the path from the current source and the reference potential disposed at respective corners opposite to each other along the diagonal. Therefore, regardless of the address of a selected memory cell, data read operation and data write operation, the path length of the electric current path is the same so that a uniform electric resistance value of the current path can be provided. Thus, the read current and the write current can be supplied in stable manner and the nonvolatile memory device performing stable operation can be implemented.

[First Modification]

In connection with the first embodiment, it is described above that the activation time width of column select gate CSG is made shortest relative to the activation time width of word line WL and dummy word line DWL so as to optimize the time for which the read current and the write current are supplied. Instead of the activation time width of column select gate CSG, the activation time width of word line WL and dummy word line DWL may be adjusted or the activation time width of word line WL and dummy word line DWL and the activation timing of the column select gate may be adjusted so as to optimize the time for which the read current and the write current are supplied.

Figure 12:
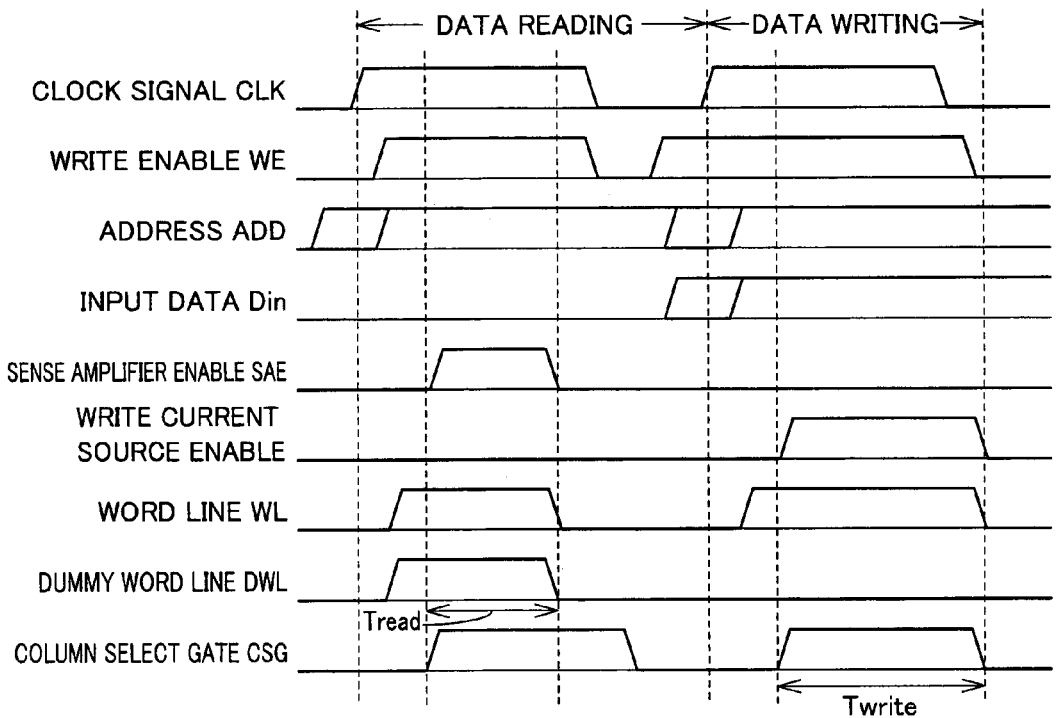
FIG. 12 shows an operation sequence of an MRAM device according to a first modification of the first embodiment of the present invention.

Referring to FIG. 12, when the condition that all of sense amplifier 22, word line WL and dummy word line DWL and paired bit lines BL, /BL are activated is satisfied, data reading is performed as described above. Then, the activation time width of word line WL and dummy word line DWL is made shorter than the one as shown in FIG. 9. In contrast, the activation time width of column select gate CSG may be made longer than the one as shown in FIG. 9. Thus, depending on the overlap period in which the activation period of word line WL and dummy word line DWL and the activation period of column select gate CSG overlap, supply duration Tread of the read current and supply duration Twrite of the write current are determined.

Therefore, by appropriately designing the activation time width or timing of word line WL and dummy word line DWL when data is to be read and data is to be written, supply duration Tread of the read current and supply duration Twrite of the write current can be optimized.

[Second Modification]

The configurations of the first embodiment and the first modification of the first embodiment may additionally be provided with adjustment of the activation time width of the sense amplifier or current sources of the read and write current so as to optimize the time for which the read current and the write current are supplied.

Figure 13:
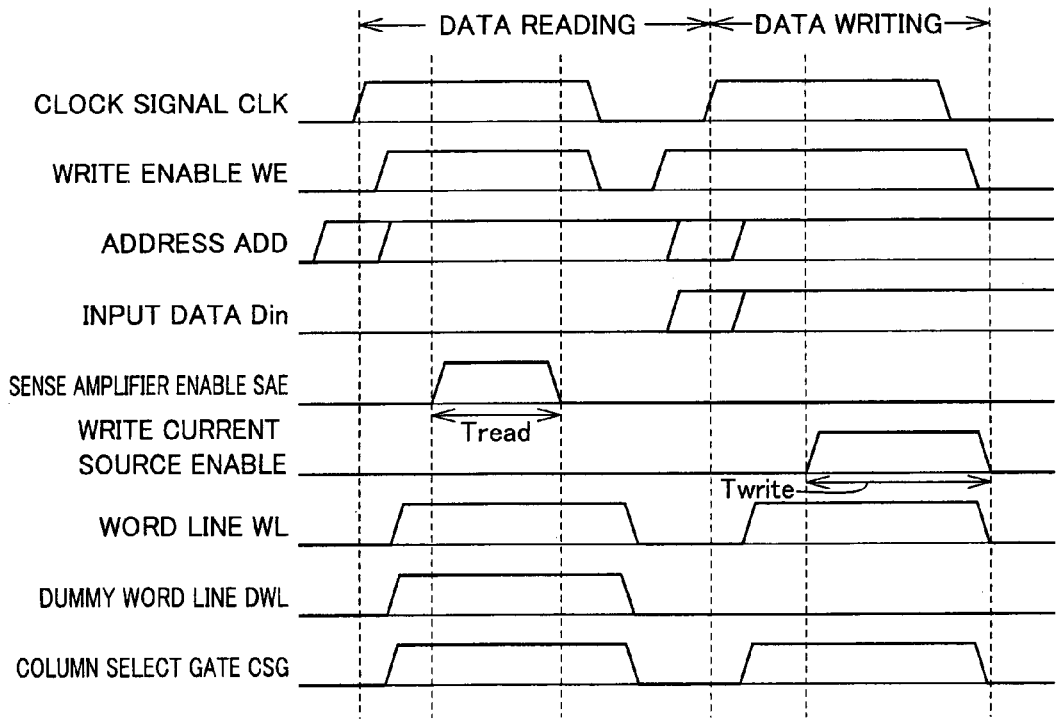
FIG. 13 shows an operation sequence of an MRAM device according to a second modification of the first embodiment of the present invention.

Referring to FIG. 13, when all of sense amplifier 22, word line WL and dummy word line DWL and paired bit lines BL, /BL are activated, data reading is performed. Then, the activation time width of sense amplifier enable SAE is made shorter than the one as shown in FIG. 9. In contrast, the activation time width of column select gate CSG may be made longer than the one as shown in FIG. 9. Then, depending on the overlap period for which the activation period of sense amplifier 22 and the activation period of column select gate CSG overlap, supply duration Tread of the read current and supply duration Twrite of the write current are determined.

Thus, by appropriately designing the activation time width of sense amplifier enable SAE and the activation time width of the current source enable SAE when data is to be read, supply duration Tread of the read current and supply duration Twrite of the write current can be optimized.

The above description of the first embodiment and modifications thereof is given in connection with the MRAM device using the spin injection mechanism. The present invention is not limited to this and is applicable as well to a variable resistance memory device, for example, RRAM (Resistance RAM) rewriting memory cell data by applying an electric current (or voltage).

Second Embodiment

In connection with the first embodiment, the description is given of the MRAM memory device using the spin injection mechanism where the read current supply duration and the write current supply duration as well as respective values of the read and write currents are optimized in consideration of the thermal assist effect. In connection with a second embodiment, a description is given of an MRAM memory device using the spin injection mechanism where the read current supply direction is optimized in consideration of the thermal assist effect.

The entire configuration of the MR device that is a typical example of the semiconductor memory device and the schematic configuration of a memory array and its peripheral circuitry of the second embodiment of the present invention are similar to those in FIGS. 1 and 2 described above. Therefore, the detailed description thereof is not repeated. Further, memory cell MC which is a component of the MRAM device of the second embodiment of the present invention is similar to the one in FIG. 3 described above. Therefore, the detailed description thereof is not repeated.

Further, the circuit operation performed when data is to be read from memory cell MC and the circuit operation performed when data is to be written to memory cell MC are similar to those in FIGS. 4 and 5 described above, except that the storage data level "1" of memory cell MC corresponds to the low resistance state (minimum resistance value) Rmin of tunneling magneto-resistance element TMR and storage data level "0" corresponds to the high resistance state (maximum resistance value) Rmax of tunneling magneto-resistance element TMR. Therefore, the detailed description is not repeated here.

Figure 14A:
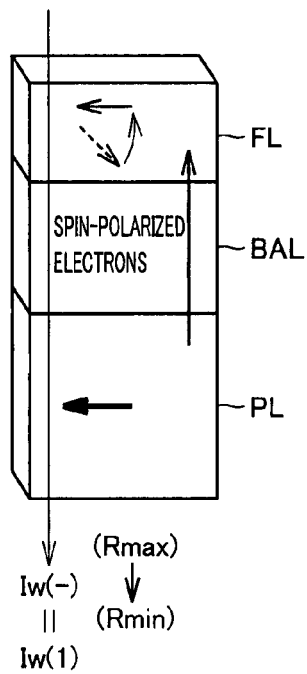
FIGS. 14A and 14B illustrate reversal of the magnetization direction of a memory cell MC according to a second embodiment of the present invention.

FIG. 14A shows the case where write current Iw (−) flows from free magnetic layer FL toward pinned magnetic layer PL.

Figure 14B:
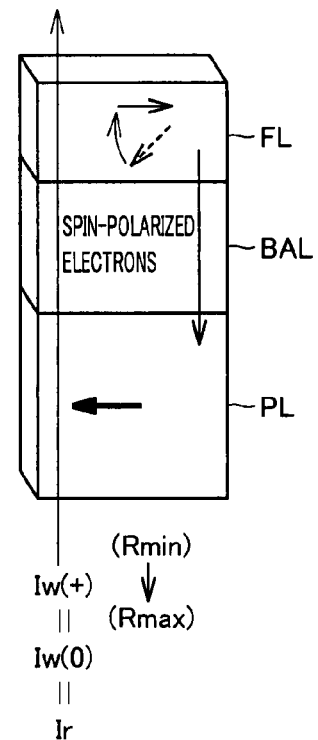

FIG. 14B shows the case where write current Iw (+) flows from pinned magnetic layer PL toward free magnetic layer FL.

The characters (−) and (+) added to write current Iw represent the directions in which the electric resistance value of tunneling magneto-resistance element TMR changes. In other words, write current Iw (−) represents a write current flowing in the direction that causes the electric resistance value of tunneling magneto-resistance element TMR from a high resistance state (maximum resistance value) Rmax to a low resistance state (minimum resistance value) Rmin, and write current Iw (+) represents a write current flowing in the direction that causes the electric resistance value of tunneling magneto-resistance element TMR from the low resistance state (minimum resistance value) Rmin to the high resistance state (maximum resistance value) Rmax.

Referring to FIG. 14A, write current Iw (−) flows from free magnetic layer FL toward pinned magnetic layer PL, thus electrons move from pinned magnetic layer PL to free magnetic layer FL and accordingly spin-polarized electrons polarized in the same direction as the electron spin direction of pinned magnetic layer PL are injected from pinned magnetic layer PL to free magnetic layer FL. Then, receiving the torque in the direction of polarization of the injected spin-polarized electrons, free magnetic layer FL has it electron spin direction changed accordingly. Finally, the direction of magnetization of free magnetic layer FL becomes identical to the direction of magnetization of pinned magnetic layer PL, namely parallel thereto. The reversal of magnetization of free magnetic layer FL changes the electric resistance value of tunneling magneto-resistance element TMR to the low resistance state (minimum resistance value) Rmin.

Referring to FIG. 14B, write current Iw (+) flows from pinned magnetic layer PL toward free magnetic layer FL, thus electrons move from free magnetic layer FL to pinned magnetic layer PL and accordingly, only the spin-polarized electrons polarized in the same direction as the electron spin direction of pinned magnetic layer PL move from free magnetic layer FL. Therefore, in free magnetic layer FL, the amount of accumulated spin-polarized electrons becomes relatively larger that are polarized in the direction opposite to the electron spin direction that is the magnetization direction of pinned magnetic layer PL. Finally, the direction of magnetization of free magnetic layer FL is opposite to namely antiparallel to the direction of magnetization of pinned magnetic layer PL. The reversal of magnetization of free magnetic layer FL changes the electric resistance value of tunneling magneto-resistance element TMR to the high resistance state (maximum resistance value) Rmax.

As described above, according to the second embodiment of the present invention, the storage data level "1" corresponds to the low resistance state (minimum resistance value) Rmin of tunneling magneto-resistance element TMR and the storage data level "0" corresponds to the high resistance state (maximum resistance value) Rmax thereof Therefore, write current Iw (−) corresponds to "1" data write current Iw (1) and write current Iw (+) corresponds to "0" data write current Iw (0).

(Data Write Characteristics)

Figure 15:
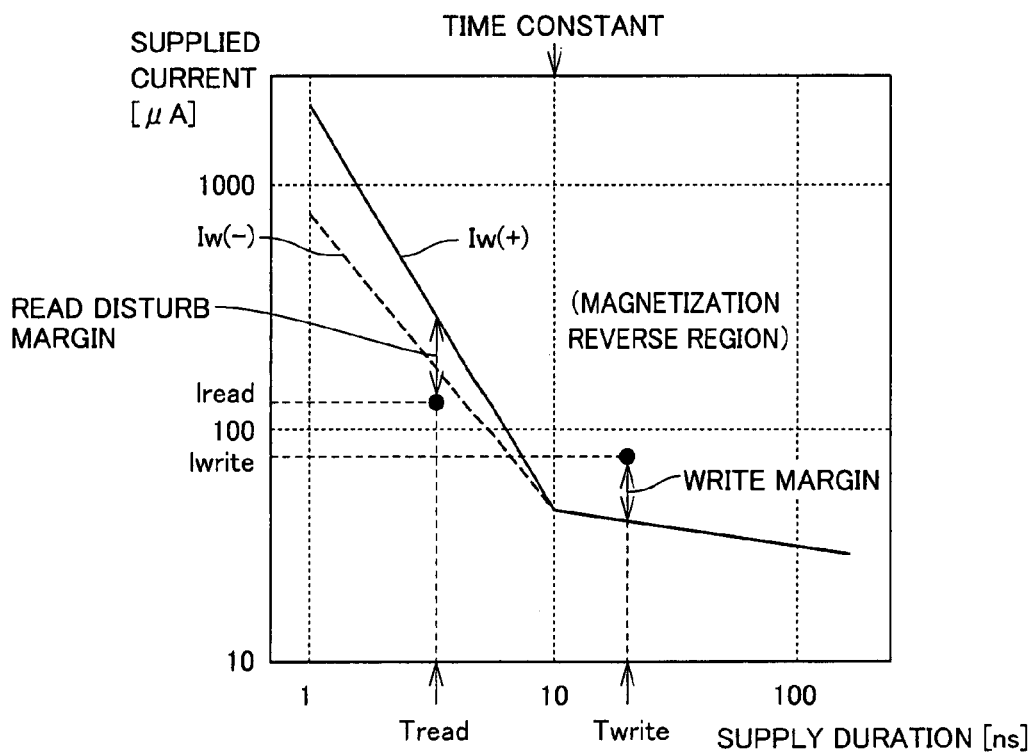
FIG. 15 is a graph showing a relation between the electric-current value of a write current Iw and the current supply duration causing magnetization reversal in a tunneling magneto-resistance element TMR.

FIG. 15 shows a relation between the electric current value and its supply duration of write current Iw causing reversal of magnetization in tunneling magneto-resistance element TMR. In the graph shown in FIG. 15, the upper region relative to the solid line is the region where the magnetization reversal occurs.

The inventor of the present invention has found that, in tunneling magneto-resistance element TMR as shown in FIGS. 14A and 14B, the absolute value of write current Iw causing the magnetization reversal is different depending on the direction in which write current Iw flows.

The mechanism of causing the magnetization reversal by injection of spin-polarized electrons to tunneling magneto-resistance element TMR has the two main factors: (I) spin torque transition between s-orbital conduction electrons and d-orbital magnetized electrons and (II) thermal assist effect due to the resistance loss of spin-polarized electrons.

Referring to FIG. 15, when the time for which write current Iw is supplied is the time constant or longer, (II) thermal assist effect is larger and thus there is substantially no difference between respective absolute values of write current Iw (−) and write current Iw (+). In contrast, regarding the region where the supply duration of write current Iw is shorter than the time constant, (II) thermal effect is smaller and thus the structural asymmetry of tunneling magneto-resistance element is conspicuous and accordingly there arises a difference between the absolute value of write current Iw (−) and the absolute value of write current Iw (+).

(Optimization of Read Current)

As described above, when the time for which write current Iw is supplied is less than the time constant, the absolute value of write current Iw (+) is larger than the absolute value of write current Iw (−). Therefore, in order that the read current may have a sufficient margin (read disturb margin) in the downward direction relative to the magnetization reversal characteristic in FIG. 15 for tunneling magneto-resistance element TMR, it is desirable that the read current is flown in the same direction as write current Iw (+) having a larger absolute value. Therefore, it is desirable that read current Ir is flown in the same direction as write current Iw (+) having a larger absolute value required for causing magnetization reversal (corresponding to "0" data write current Iw (0) in the second embodiment of the invention).

As seen from the above, by determining the read-current flow direction, the read disturb margin can be made relatively large. Further, for increasing the sensing speed of sense amplifier 22 (FIG. 2), it is desirable that the read current value is as large as possible. Then, in the case where the read disturb margin can be ensured relative to write current Iw (+), the electric current value of the read current can be made larger than the electric current value of the write current within the range of the ensured read disturb margin.

Other details are similar to those of the first embodiment of the present invention and therefore the description thereof is not repeated.

In accordance with the second embodiment of the present invention, to the memory cell for which the absolute value of the write current required for changing the electric resistance value (causing reversal of magnetization of the tunneling magneto-resistance element) is different depending on the direction in which the write current flows, the read current is supplied in the direction identical to the direction of the write current having a larger absolute value for causing a change of the electric resistance value. Therefore, the difference between the absolute value of the write current required for changing the electric resistance value and the absolute value of the read current, namely the read disturb margin can be increased. Thus, the nonvolatile memory device can be implemented, without causing a memory cell to become unstable when data is to be read, while suppressing the read disturb and having an increased access speed.

Third Embodiment

In connection with the second embodiment of the present invention, the tunneling magneto-resistance element is described for which there is a difference between the absolute value of the write current required for changing the electric resistance value from the high resistance state to the low resistance state and the absolute value of the write current required for changing the electric resistance value from the low resistance state to the high resistance state. In contrast, in connection with a third embodiment of the present invention, a tunneling magneto-resistance element is described for which respective absolute values of write currents required for causing the electric resistance value to the high and low resistance states are substantially equal to each other.

The entire configuration of the MRAM device that is a typical example of the nonvolatile memory device of the third embodiment and the schematic configuration of a memory array and its peripheral circuitry of the third embodiment of the present invention are similar to those in FIGS. 1 and 2 described above. Therefore, the detailed description thereof is not repeated.

FIG. 16 is a conceptual view illustrating a memory cell MC according to the third embodiment of the present invention.

Referring to FIG. 16, a tunneling magneto-resistance element TMR# is equivalent to the tunneling magneto-resistance element TMR in FIG. 3 in which free magnetic layer FL is replaced with a free magnetic portion FL#.

Free magnetic portion FL# is formed to include, in the order closer to barrier layer BAL, a first free magnetic layer FL1, a first nonmagnetic layer AML1, a second free magnetic layer FL2, a second nonmagnetic layer AML2 and a pinned magnetic layer PL# that are stacked on each other. First free magnetic layer FL1 and second free magnetic layer FL2 have respective magnetization directions kept opposite to each other while changing the direction of magnetization according to the direction in which the write current flows. In other words, first free magnetic layer FL1 and second free magnetic layer FL2 form a so-called SAF (Synthetic Anti-Ferromagnet) structure together with first nonmagnetic layer AML1 provided therebetween. Therefore, magnetization of first free magnetic layer FL1 and magnetization of second free magnetic layer cancel each other to provide a substantially non-magnetized state as a whole.

As seen from the above, free magnetic portion FL# having the SAF structure can suppress the structural asymmetry. Therefore, respective absolute values of write currents required for changing the magnetization directions of first free magnetic layer FL1 and second free magnetic layer FL2 are almost equal to each other for any of the directions.

Pinned magnetic layer PL# joined with second free magnetic layer FL2 with second nonmagnetic layer AML2 interposed therebetween is a ferromagnet having the same magnetization direction as the fixed magnetization direction of fixed magnetic layer PL. Therefore, in free magnetic portion FL# as a whole, magnetization substantially identical to that of pinned magnetic layer PL is always maintained regardless of the write current.

Further, the electric resistance value of tunneling magneto-resistance element TMR# is changed according to the relative relation between respective magnetization directions of first free magnetic layer FL1 of free magnetic portion FL# and pinned magnetic layer PL. Specifically, the electric resistance of tunneling magneto-resistance element TMR# is the low resistance state Rmin when the magnetization direction of first free magnetic layer FL1 and the magnetization direction of pinned magnetic layer PL are identical (parallel) to each other and is the high resistance state Rmax when respective magnetization directions are opposite (antiparallel) to each other.

Therefore, for tunneling magneto-resistance element TMR# according to the third embodiment of the present invention, respective absolute values of write currents required to change the resistance value (cause reversal of magnetization) are substantially identical to each other regardless of the direction in which the write currents flows.

As to other details, they are similar to those of tunneling magneto-resistance element TMR shown in FIG. 3, and the description thereof is not repeated.

FIG. 17A shows the case where write current Iw (−) flows from free magnetic portion FL# toward pinned magnetic layer PL.

FIG. 17B shows the case where write current Iw (+) flows from pinned magnetic layer PL toward free magnetic portion FL#.

The characters (−) and (+) added to write current Iw represent the directions in which the electric resistance value of tunneling magneto-resistance element TMR# changes. In other words, write current Iw (−) represents a write current flowing in the direction that changes the electric resistance value of tunneling magneto-resistance element TMR# from the high resistance state (maximum resistance value) Rmax to the low resistance state (minimum resistance value) Rmin, and write current Iw (+) represents a write current flowing in the direction that changes the electric resistance value of tunneling magneto-resistance element TMR# from the low resistance state (minimum resistance value) Rmin to the high resistance state (maximum resistance value) Rmax.

Referring to FIG. 17A, write current Iw (−) flows from free magnetic portion FL# toward pinned magnetic layer PL to cause electrons to move from free magnetic layer PL to first free magnetic layer FL1 and also cause electrons to move from second free magnetic layer FL2 to pinned magnetic layer PL#.

As the electrons thus move, spin-polarized electrons that are polarized in the same direction as the electron spin direction of pinned magnetic layer PL are injected from pinned magnetic layer PL to first free magnetic layer FL1. Then, first free magnetic layer FL1 receives the torque in the polarization direction of the injected spin-polarized electrons to change its electron spin direction. Finally, the magnetization direction of first free magnetic layer FL1 becomes identical to the magnetization direction of pinned magnetic layer PL, namely parallel thereto.

From second free magnetic layer FL2, only the spin-polarized electrons polarized in the same direction as the electron spin direction of pinned magnetic layer PL# move. Therefore, in second free magnetic layer FL2, the amount of accumulated spin-polarized electrons that are polarized in the opposite direction to the electron spin direction that is the magnetization direction of pinned magnetic layer PL# becomes relatively larger. Finally, the magnetization direction of second free magnetic layer FL2 becomes opposite to the magnetization direction of pinned magnetic layer PL#, namely antiparallel thereto.

Since write current Iw (−) flows through tunneling magneto-resistance element TMR#, respective amounts of the injected spin-polarized electrons are substantially equal to each other. As a result, first free magnetic layer FL1 and second free magnetic layer FL2 have respective magnetization directions kept opposite to each other and change respective magnetization directions to the directions according to the direction in which write current Iw (−) flows. At the same time, the reversal of magnetization of first free magnetic layer FL1 located near the pinned magnetic layer PL causes the electric resistance value of tunneling magneto-resistance element TMR# as a whole to change to the low resistance state (minimum resistance value) Rmin.

Referring to FIG. 17B, write current Iw (+) flows from pinned magnetic layer PL toward free magnetic portion FL# to cause electrons to move from first free magnetic layer FL1 to pinned magnetic layer PL and also cause electrons to move from pinned magnetic layer PL# to second free magnetic layer FL2.

As the electrons thus move, only the spin-polarized electrons that are polarized in the same direction as the electron spin direction of pinned magnetic layer PL move from first free magnetic layer FL1. Therefore, in first free magnetic layer FL1, the amount of accumulated spin polarized electrons that are polarized in the opposite direction to the electron spin direction that is the magnetization direction of pinned magnetic layer PL becomes relatively larger. Finally, the magnetization direction of first free magnetic layer FL1 becomes opposite to the magnetization direction of pinned magnetic layer PL, namely antiparallel thereto.

Further, spin-polarized electrons that are polarized in the same direction as the electron spin direction of pinned magnetic layer PL# are injected from pinned magnetic layer PL# to second free magnetic layer FL2. Then, second free magnetic layer FL2 receives the torque in the polarization direction of the injected spin-polarized electrons to have its electron spin direction changed. Finally, the magnetization direction of second free magnetic layer FL2 becomes identical, namely parallel to the magnetization direction of pinned magnetic layer PL#.

Since write current Iw (+) flows through tunneling magneto-resistance element TMR#, respective amounts of injected spin-polarized electrons are almost equal to each other. As a result, first free magnetic layer FL 1 and second free magnetic layer FL2 have respective magnetization directions kept opposite to each other while changing respective magnetization directions according to the direction in which write current Iw (+) flows. At the same time, the reversal of magnetization of first free magnetic layer FL1 located near pinned magnetic layer PL causes the electric resistance value of tunneling magneto-resistance element TMR# as a whole to change to the high resistance state (maximum resistance value) Rmax.

(Data Write Characteristics)

Figure 18:
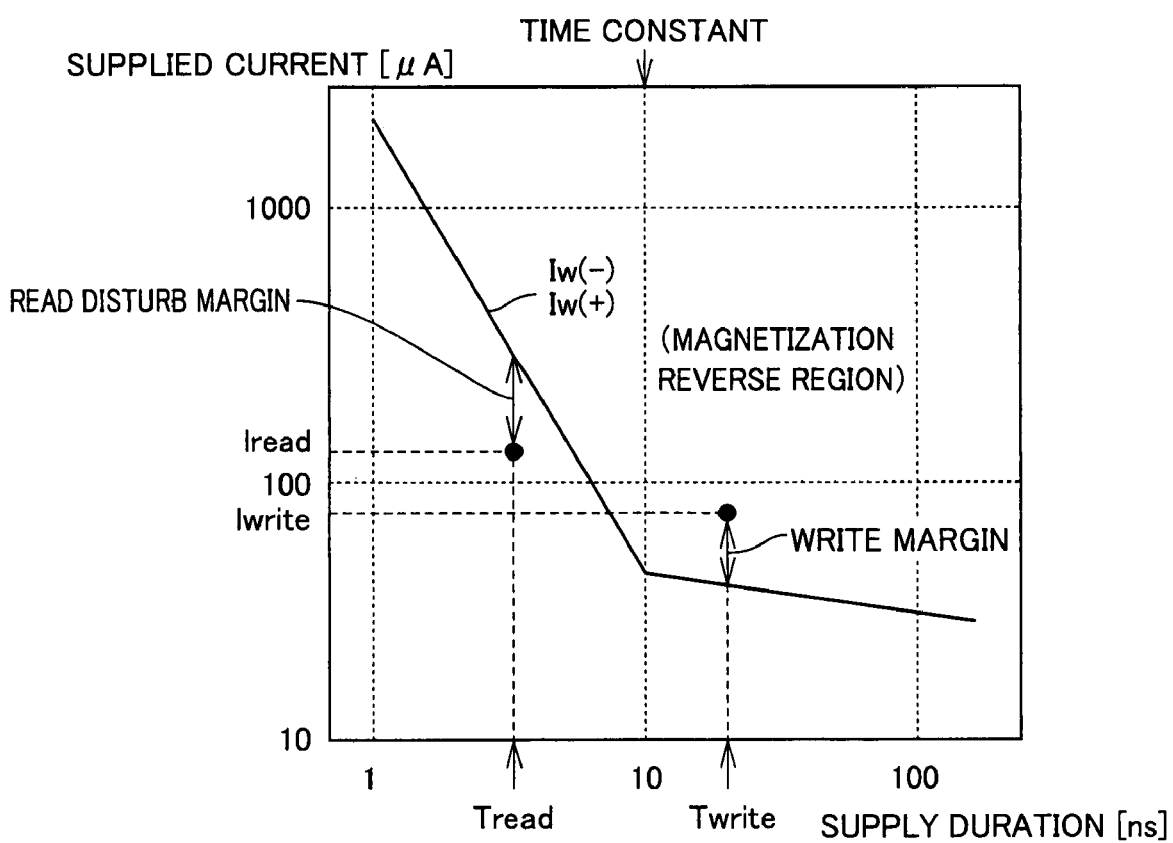
FIG. 18 is a graph showing a relation between the electric-current value of a write current Iw and the current supply duration causing magnetization reversal in a tunneling magneto-resistance element TMR#.

FIG. 18 shows a relation between the electric current value and the supply duration of write current Iw causing reversal of magnetization in tunneling magneto-resistance element TMR#. In the graph shown in FIG. 18, the upper region relative to the solid line is the region where reversal of magnetization occurs.

As described above, regarding tunneling magneto-resistance element TMR# including the SAF structure, for respective directions in which write current Iw flows, respective absolute values of write currents Iw causing the reversal of magnetization are substantially identical to each other. Therefore, for both of write current Iw (−) and write current Iw (+), the relation between the electric current value and the supply duration of the write current causing the magnetization reversal as shown in FIG. 7 described above is obtained.

(Optimization of Read Current)

As described above, regardless of the direction in which write current Iw flows, the magnetization reversal characteristics are substantially identical. Therefore, in terms of increasing the read disturb margin, it seems that the read current may be flown in any direction. However, as shown in FIG. 11 described above, sense amplifier 22 generates the read current as power supply voltage Vdd is supplied to a plurality of series-connected transistors. Thus, sense amplifier 22 has the function of a voltage source and the electric current value of the flowing read current Ir is varied according to the electric resistance value of the connected memory cell MC namely tunneling magneto-resistance element TMR#.

Therefore, in the case where tunneling magneto-resistance element TMR# is in the high resistance state (maximum resistance value Rmax) as compared with the case where it is in the low resistance state (minimum resistance value Rmin), the read-current supplied from sense amplifier 22 has a smaller absolute value. This means that the direction in which the read current flows may be made identical to the direction of write current Iw (−) flowing in the direction that causes the electric resistance value of tunneling magneto-resistance element TMR# to change from the high resistance state (maximum resistance value) Rmax to the low resistance state (minimum resistance value) Rmin, so as to increase the read disturb margin.

Then, in the third embodiment of the preset invention, write current Iw (−) corresponds to "0" data write current Iw (0) and write current Iw (+) corresponds to "1" data write current Iw (1). By this assignment of the storage data levels "0" and "1", memory array 10 and its peripheral circuitry configured as shown in FIG. 2 can be used to allow the direction in which read current Ir flows to be identical to write current Iw (−).

When read current Ir is used that flows in the same direction as write current Iw (−), the read disturb similar to the magnetization reversal caused by write current Iw (+) does not occur. Namely, since read current Ir acts in the direction causing tunneling magneto-resistance element TMR# to change from the high resistance state (maximum resistance value Rmax) to the low resistance state (minimum resistance value Rmin), read current Ir does not cause tunneling magneto-resistance element TMR# to change from the low resistance state (minimum resistance value Rmin) to the high resistance state (maximum resistance value Rmax).

As seen from the above, by determining the direction in which the read curent flows, the read disturb margin can be made relatively larger. Further, for increasing the sensing speed of sense amplifier 22 (FIG. 2), the read current value is preferably as large as possible. Then, in the case where the read disturb margin for write current Iw (−) can be ensured, the electric current value of the read curent can be made larger than the electric current value of the write current within the range of the ensured read disturb margin.

As to other details, they are similar to those of the first embodiment of the present invention described above and thus the description thereof is not repeated.

In accordance with the third embodiment of the present invention, the read current is supplied in the direction identical to the direction of the write current flown to change the resistance value from a larger value to a smaller value for the memory cell for which respective absolute values of write currents required to change the resistance value (or to reverse magnetization of the tunneling magneto-resistance element) are substantially identical to each other regardless of the direction in which the write current flows. Therefore, in the case where the memory cell is connected to a common power supply voltage for indirectly measuring the electric resistance value of the memory cell, the absolute value of the read current that could cause the read disturb can be made relatively small. Therefore, the nonvolatile memory device can be implemented for which the read disturb can be suppressed and which can be increased in access speed without making the memory cell unstable.

Fourth Embodiment

In connection with the first to third embodiments, the configuration is described of the MRAM memory device using the spin injection mechanism, for performing data reading and data writing in consideration of the thermal assist effect. In contrast, regarding a fourth embodiment, a configuration is described of the currently used MRAM device, for performing data reading and data writing in consideration of the thermal assist effect.

Figure 19:
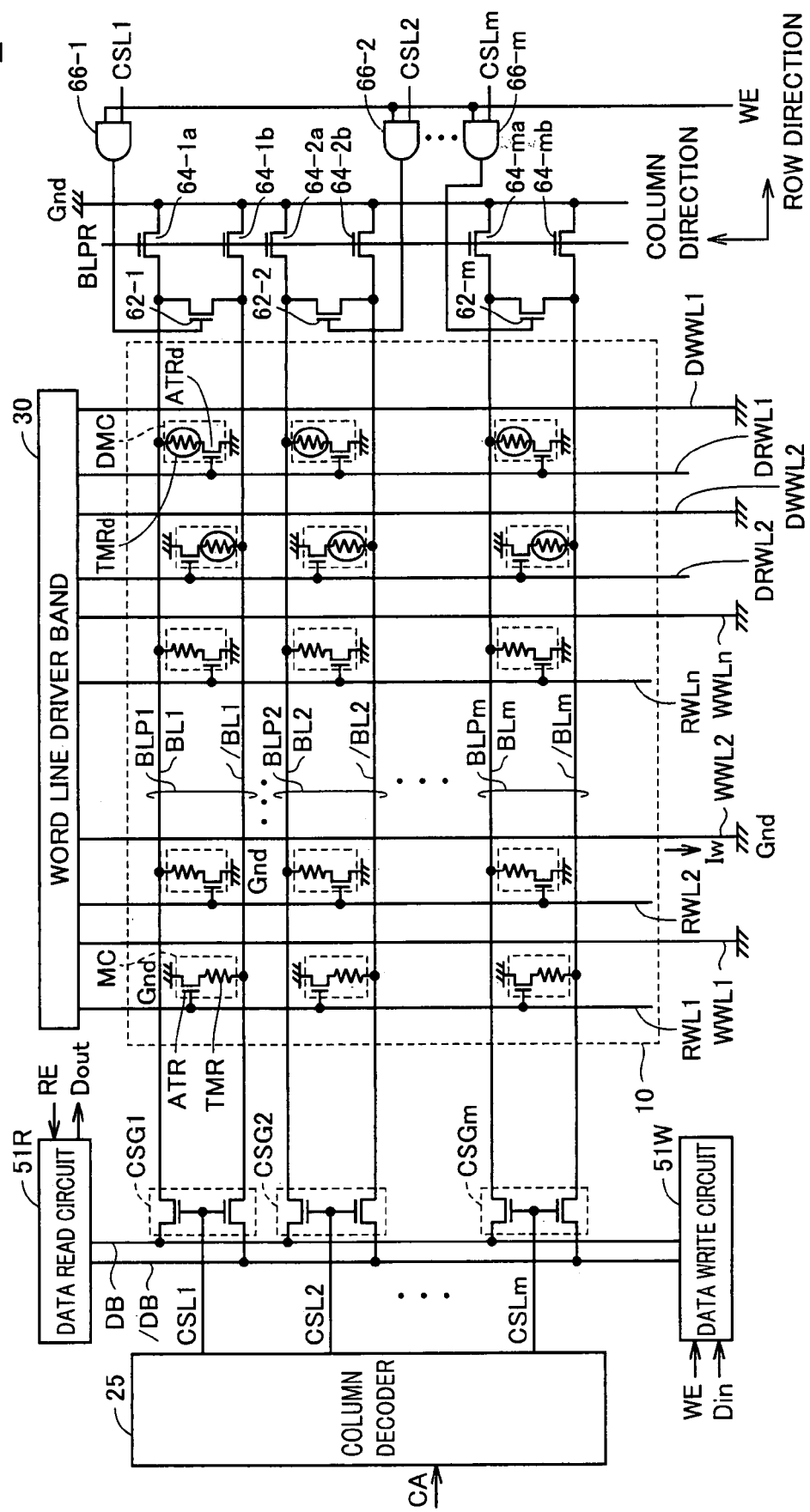
FIG. 19 is a schematic block diagram showing an entire configuration of an MRAM device according to a fourth embodiment of the present invention.

Referring to FIG. 19, an MRAM device 2 according to the fourth embodiment of the present invention performs, like the MRAM device of the first embodiment of the present invention as described above, random access according to externally supplied control signal (not shown) and address signal and performs the operation of inputting input data Din and outputting output data Dout.

MRAM device 2 includes a memory array 10 having memory cells MC arranged in a matrix of n rows×m columns (n, m: natural number).

In memory array 10, read word lines RWL1 to RWLn for reading data and write word lines WWL1 to WWLn for writing data are arranged correspondingly to memory cell rows. Bit line pairs BLP1 to BLPm are arranged correspondingly to memory cell columns respectively. Each bit line pair is comprised of two complementary bit lines. For example, bit line pair BLP1 is comprised of bit lines BL1 and /BL1.

Each memory cell MC includes a tunneling magneto-resistance element TMR and an access transistor ATR connected in series with the tunneling magneto-resistance element. Memory cells MC are connected to one of bit line BL and bit line /BL in alternate rows. For example, regarding memory cells belonging to the first memory cell column, the memory cell in the first row is connected to bit line /BL1, the memory cell in the second row is connected to bit line BL1 and the subsequent memory cells are connected in this manner. Thus, the memory cells in the odd-numbered rows are connected to one bit lines /BL1 to /BLm and the memory cells in the even-numbered rows are connected to the other bit lines BL1 to BLm.

Further, memory array 10 has a plurality of dummy memory cells DMC for reference in reading data that are coupled respectively to bit lines BL1, /BL1 to BLm, /BLm.

Dummy memory cells DMC are arranged in a matrix of two rows×m columns so that the dummy memory cells each correspond to one of dummy read word lines DRWL1 and DRWL2. Dummy memory cells corresponding to dummy read word line DRWL1 are coupled respectively to bit lines BL1 to BLm. The remaining dummy memory cells corresponding to dummy read word line DRWL2 are coupled respectively to bit lines /BL1 to /BLm. Further, dummy write word lines DWWL1, DWWL2 are arranged correspondingly to respective rows of the dummy memory cells.

When data is to be read, a word line driver band 30 selectively activates any of read word lines RWL and any of dummy read word lines DRWL1, DRWL2 to H level according to the result of row selection. Specifically, in the case where an odd-numbered row is selected-and the memory cells of the selected row are connected to bit lines /BL1 to /BLm, dummy read word line DRWL1 is further activated to connect the dummy memory cells to bit lines BL1 to BLm. In the case where an even-numbered row is selected, dummy read word line DRWL2 is activated in addition to read word line RWL of the selected row.

When data is to be written, word line driver band 30 couples one end of write word line WWL of a selected row to power supply voltage Vdd. Accordingly, on write word line WWL of the selected row, a data write current in the row direction can be flown from word line driver band 30 in the downward direction as seen in FIG. 19. Write word lines WWL of non-selected rows are coupled by word line driver band 30 to reference potential Gnd.

In MRAM device 2, column select lines CSL1 to CSLm for performing column selection are provided correspondingly to respective memory cell columns. A column decoder 25 activates one of column select lines CSL1 to CSLm to the selected state (H level for example) according to the result of decoding of column address CA, namely according to the result of the column selection in each of the data write operation and the data read operation.

MRAM device 2 further includes data lines DB and /DB complementary to each other and used for transmitting read data and write data, a data write circuit 51W, a data read circuit 51R, and column select gates CSG1 to CSGm provided correspondingly to respective memory cell columns. In the following, column select lines CSL1 to CSLm and column select gates CSG1 to CSGm are also referred to collectively and simply as column select line CSL and column select gate CSG.

Each column select gate CSG includes a transistor switch electrically coupled between data line DB and its corresponding bit line BL and a transistor switch electrically coupled between data line /DB and its corresponding bit line /BL. These transistor switches are turned on and off according to the voltage of the corresponding column select line CSL. Specifically, when corresponding column select line CSL is activated to the selected state (H level), each column select gate CSG electrically couples data lines DB and /DB to respective corresponding bit lines BL and /BL.

Moreover, MRAM device 2 includes short-circuit switch transistors 62-1 to 62-*m* and control gates 66-1 to 66-*m* provided correspondingly to respective memory cell columns, and precharge transistors 64-1*a*, 64-1*b* to 64-*ma*, 64-*mb* provided respectively between paired bit lines BL1, /BL1 to BLm, /BLm and reference potential Grid.

In the following, short-circuit switch transistors 62-1 to 62*m*, precharge transistors 64-1*a*, 64-1*b* to 64-*ma*, 64-*mb*, and control gates 66-1 to 66-*m* are also referred to collectively and simply as short-circuit switch transistor 62, precharge transistor 64 and control gate 66, respectively.

Each control gate 66 outputs the result of the AND operation of corresponding column select line CSL and control signal WE. Therefore, when data is to be written, in a selected column corresponding to column address CA, the output of control gate 66 is selectively activated to H level.

Short-circuit switch transistor 62 is turned on and off in response to the output of a corresponding control gate 66. Therefore, when data is to be written, in the selected column corresponding to column address CA, respective one ends of bit lines BL and /BL are electrically coupled by short-circuit switch transistor 62.

Each precharge transistor 64 is turned on in response to activation of bit line precharge signal BLPR to precharge paired bit lines BL1, /BL1 to BLm, /BLm each to reference potential Gnd. While MRAM device 2 is in an active period, bit line precharge signal BLPR is activated to H level at least for a predetermined period before data read operation is performed. In contrast, when data is to be read and when data is to be written while MRAM device 2 is in an active period, bit line precharge signal BLPR is inactivated to L level and precharge transistor 64 is turned off.

According to the fourth embodiment, write word line WWL implements "write line" and bit lines BL and /BL implement "first and second read lines."

(Data Write Operation)

Word line driver band 30 activates write word line WWL corresponding to a selected row of a selected memory cell to power supply voltage Vdd. Since one end of each write word line WWL is coupled to reference potential Gnd, a data write current is flown through write word line WWL of the selected row in the direction from word line driver band 30 downwardly as seen in FIG. 19. In non-selected rows, write word line WWL is kept in the inactive state (L level) and thus the data write current does not flow therethrough.

When column decoder 25 activates column select line CSL of a selected column to the selected state (H level), respective one ends of bit lines BL and /BL of the selected column are coupled respectively to data lines DB and /DB. Further, corresponding short-circuit switch transistor 62 is turned on to short-circuit respective other ends of bit lines BL and /BL of the selected column.

Data write circuit 51W sets data lines DB and /DB each to one of power supply voltage Vdd and reference potential Grid. For example, when the data level of input data Din is L, write current −Iw is flown through data line DB for writing the L level data.

Data write current −Iw flown through bit line BL of the selected column turns around by short-circuit transistor 62. Thus, in the other bit line /BL, data write current +Iw in the opposite direction flows. Data write current +Iw flowing in bit line /BL is transmitted via column select gate CSG to data line /DB.

When the data level of input data Din is H, respective voltage settings for data lines DB and /DB may be replaced with each other to allow the data write current in the opposite direction to be flown in bit lines BL, /BL of the selected column.

In this way, the data is written to the selected memory cell for which the data write current is flown in both of the corresponding write word line WWL and bit line BL (/BL).

Figure 20:
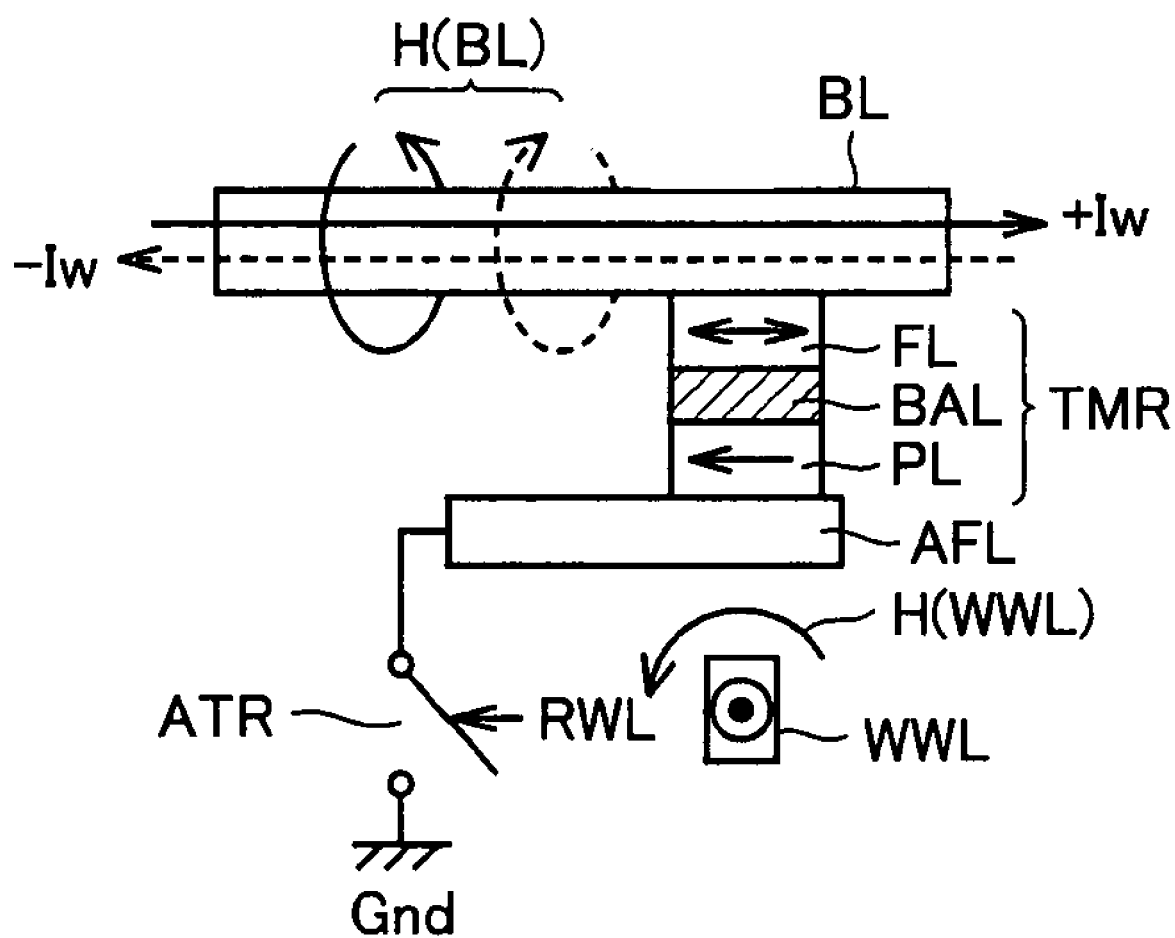
FIG. 20 conceptually illustrates a memory cell configuration and a data storage principle according to the fourth embodiment of the present invention.

Referring to FIG. 20, tunneling magneto-resistance element TMR is comprised of, similarly to the first embodiment, a pinned magnetic layer PL that is a ferromagnet having a certain fixed magnetization direction, a free magnetic layer FL that is a ferromagnet having its magnetization direction reversed according to the current flowing through the element, and a barrier layer BAL that is an insulating film formed to generate the tunnel effect between pinned magnetic layer PL and free magnetic layer FL.

Free magnetic layer FL is magnetized in the direction identical (parallel) to the magnetization direction of pinned magnetic layer PL or opposite (antiparallel) thereto according to the direction in which the write current flows that is changed according to the level of data to be written. By these pinned magnetic layer PL, barrier layer BAL and free magnetic layer FL, a magnetic tunneling junction (MTJ) is formed.

The electric resistance value of tunneling magneto-resistance element TMR is changed according to the relative relation between respective magnetization directions of pinned magnetic layer PL and free magnetic layer FL. Specifically, the electric resistance of tunneling magneto-resistance element TMR is a low resistance state Rmin when respective magnetization directions of free magnetic layer FL and pinned magnetic layer PL are identical (parallel) to each other and is a high resistance state Rmax when respective magnetization directions are opposite (antiparallel) to each other.

When data is to be written, read word line RWL is inactivated and access transistor ATR is turned off. In this state, data write magnetic fields H (BL) and H (WWL) for magnetizing free magnetic layer FL are generated respectively by data write currents flowing in bit line BL and write word line WWL. In particular, the data write current on bit line BL is set, according to the level of the write data, to one of +Iw and −Iw in opposite directions respectively. Therefore, the direction of data write magnetic field H (BL) applied to free magnetic layer FL is reversed according to the level of the write data.

Here, by write magnetic field H (WWL) applied from write word line WWL, thermal energy is generated on tunneling magneto-resistance element TMR, causing the magnetization direction of free magnetic layer FL of tunneling magneto-resistance element TMR to become unstable. Specifically, due to write magnetic field H (WWL) applied from write word line WWL, "thermal assist effect" occurs on tunneling magneto-resistance element TMR. Therefore, the relation between the value of the write current in write word line WWL and the supply duration thereof that cause reversal of magnetization is similar to that in FIG. 7 of the first embodiment of the present invention.

Therefore, if the time for which the write current is supplied in write word line WWL is increased, the reliability of storage data of tunneling magneto-resistance element TMR against the ambient temperature, namely thermal disturbance resistance is deteriorated. Then, the time for which the write current is supplied in write word line WWL is set shorter than a time constant of a temperature increase of tunneling magneto-resistance element TMR that is caused by write magnetic field H (WWL) applied by the write current. Specifically, word line driver band 30 controls the time so that the time for which one end of write word line WWL of a selected row is coupled to power supply voltage Vdd is a predetermined time. Further, it is preferable that the time for which the write current is supplied in write word line WWL is shorter than 5 [ns].

(Data Read Operation)

Referring again to FIG. 19, word line driver band 30 activates read word line RWL corresponding to a selected row of a selected memory cell to H level. In non-selected rows, the voltage level of read word line RWL is kept in the inactive state (L level). The data read operation for the selected row is started, read word line RWL of the selected row is activated and corresponding access transistor ATR is turned on, and then memory cell MC corresponding to the selected row is electrically coupled via access transistor ATR between bit lines BL, /BL and reference potential Gnd.

Data read circuit 51R supplies a predetermined read current to data lines DB and /DB. Column decoder 25 activates column select line CSL of a selected column to the selected state (H level) according to column address CA, which is similar to the data write operation.

Accordingly, the read current supplied from column decoder 25 flows via data lines DB, /DB and bit lines BL, /BL of the selected column and flows through tunneling magneto-resistance element TMR of selected memory cell MC. Thus, on one of bit lines BL, /BL of the selected column and one of data lines DB, /DB, a voltage change occurs according to the electric resistance value of tunneling magneto-resistance element TMR, namely the level of the storage data of the selected memory cell. Similarly, on the other bit line BL, /BL of the selected column and the other data line DB, /DB, a voltage change occurs according to the electric resistance value of dummy resistance element TMRd of dummy memory cell DMC.

Data read circuit 51R detects and amplifies the voltage difference thus generated between data lines DB and /DB to output the storage data of the selected memory cell as output data Dout.

Here, the read current supplied from bit line BL or /BL flows through tunneling magneto-resistance element TMR to generate thermal energy in tunneling magneto-resistance element TMR and thereby cause the magnetization direction of free magnetic layer FL in tunneling magneto-resistance element TMR to become unstable. In other words, the read current causes "thermal assist effect" on tunneling magneto-resistance element TMR.

Therefore, if, like the write operation as described above, the time for which the read current is supplied is increased, reliability of storage data of tunneling magneto-resistance element TMR against the ambient temperature, namely deteriorate thermal disturbance resistance. Then, the time for which the read current is supplied is set shorter than a time constant for a temperature increase of tunneling magneto-resistance element TMR that is caused by the read current. Specifically, by any of or a combination of some of the control of the activation time of read word line RWL by word line driver band 30, the control of the read current supply duration by data read circuit 51 and the control of the activation time of column select line CSL by the column decoder, the time for which the read current is supplied is controlled so that the supply duration is a predetermined time. Further, preferably the supply duration for which the read current is supplied is shorter than 10 [ns].

In accordance with the fourth embodiment of the present invention, the write current is supplied to a write word line corresponding to a selected memory cell so that the write current supply duration is shorter than the time constant of the temperature increase of the memory cell caused by application of a write magnetic field. Further, the read current is supplied to a selected memory cell so that the read current supply duration is shorter than a time constant of a temperature increase of the memory cell caused by the read current. In this way, the thermal assist effect of the memory cell due to the write magnetic field and the read current can be suppressed and the nonvolatile memory device can be implemented having improved thermal disturbance resistance against external temperature disturbance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising:
a plurality of memory cells arranged in rows and columns;
first and second current supply lines provided correspondingly to each of the columns where said plurality of memory cells are arranged; and
a data write and read circuit writing data by supplying a write current to a selected memory cell through the first and second current supply lines and reading data by supplying a read current to a selected memory cell through the first and second current supply lines,
each memory cell of said plurality of memory cells having a resistance value changeable in nonvolatile manner by receiving said write current flowing in a direction according to write data,
said data write and read circuit reading data based on the resistance value of said selected memory cell detected by supplying said read current, and
said data write and read circuit supplying said read current for a supply duration shorter than a supply duration for which said write current is supplied, wherein
said data write and read circuit supplies said read current for the supply duration shorter than a time constant of a temperature increase of a memory cell that is caused by a supplied current.

2. The nonvolatile memory device according to claim 1, wherein
the supply duration of said read current is shorter than 10 nanoseconds.

3. The nonvolatile memory device according to claim 1, wherein
said data write and read circuit supplies said read current having its electric current value relatively larger than an electric current value of said write current.

4. The nonvolatile memory device according to claim 1, wherein
said plurality of memory cells each include a magneto-resistance element magnetically storing data in nonvolatile manner,
said magneto-resistance element includes:
a pinned magnetic layer having its magnetization direction fixed in a predetermined direction; and
a free magnetic layer having its magnetization direction changeable according to a direction in which an electric current flows that is supplied through said first and second current supply lines, and
said magneto-resistance element has its resistance value changeable according to a relative relation between respective magnetization directions of said fixed magnetic layer and said free magnetic layer.

5. The nonvolatile memory device according to claim 4, wherein
said magneto-resistance element further includes a barrier layer provided between said pinned magnetic layer and said free magnetic layer and made of a nonmagnetic material, and
said free magnetic layer has its magnetization direction changeable due to movement of spin-polarized electrons caused by an electric current supplied from said first and second current supply lines.

6. A nonvolatile memory device comprising:
a plurality of memory cells arranged in rows and columns;
first and second current supply lines provided correspondingly to each of the columns where said plurality of memory cells are arranged; and
a data write and read circuit writing data by supplying a write current to a selected memory cell through the first and second current supply lines and reading data by supplying a read current to a selected memory cell through the first and second current supply lines,
each memory cell of said plurality of memory cells having a resistance value changeable in nonvolatile manner by receiving said write current flowing in a direction according to write data,
said data write and read circuit reading data based on the resistance value of said selected memory cell detected by supplying said read current, and
said data write and read circuit supplying said read current in a predetermined direction based on an absolute value of said write current required to change said resistance value for each direction in which said write current flows, wherein
for each memory cell of said plurality of memory cells, the absolute value of said write current required to change said resistance value is different depending on the direction in which said write current flows, and
said data write and read circuit supplies said read current in a direction identical to a direction of said write current having a relatively larger absolute value required to change said resistance value.

7. The nonvolatile memory device according to claim 6, wherein
said plurality of memory cells each include a magneto-resistance element magnetically storing data in nonvolatile manner,
said magneto-resistance element includes:
a pinned magnetic layer with its magnetization direction fixed in a predetermined direction; and
a free magnetic layer having its magnetization direction changeable according to a direction in which an electric current flows that is supplied through said first and second current supply lines, and
said magneto-resistance element has its resistance value changeable according to a relative relation between respective magnetization directions of said fixed magnetic layer and said free magnetic layer.

8. The nonvolatile memory device according to claim 7, wherein
said magneto-resistance element further includes a barrier layer provided between said pinned magnetic layer and said free magnetic layer and made of a nonmagnetic material, and
said free magnetic layer has its magnetization direction changeable due to movement of spin-polarized electrons caused by an electric current supplied from said first and second current supply lines.

9. The nonvolatile memory device according to claim 6, wherein
said plurality of memory cells are each configured so that respective absolute values of said write current required to change said resistance value for respective directions in which said write current flows are substantially identical to each other, and
said data write and read circuit supplies said read current in a direction identical to the direction of said write current supplied for changing said resistance value from a larger value to a smaller value.

10. A nonvolatile memory device comprising:
a plurality of memory cells storing data by applying a write magnetic field generated by a write current flowing in a direction according to write data;
a write line disposed adjacent to said plurality of memory cells for supplying said write current;

a data write circuit supplying said write current to a plurality of said write lines;

first and second read lines connected to each memory cell of said plurality of memory cells; and a data read circuit reading data based on a resistance value of said memory cell detected by supplying an electric current to said first and second read lines, said data write circuit supplying said write current for a supply duration shorter than a time constant of a temperature increase of said memory cell caused by applying said write magnetic field, wherein said data read circuit supplies said read current for a supply duration shorter than a time constant of a temperature increase of said memory cell caused by supplying said read current.

11. The nonvolatile memory device according to claim 10, wherein the supply duration of said write current is shorter than 5 nanoseconds.

12. The nonvolatile memory device according to claim 10, wherein the supply duration of said read current is shorter than 10 nanoseconds.

13. A nonvolatile memory device comprising:

a plurality of memory cells arranged in rows and columns;

first and second current supply lines provided correspondingly to each of the columns where said plurality of memory cells are arranged; and a data write and read circuit writing data by supplying a write current to a selected memory cell through the first and second current supply lines and reading data by supplying a read current to a selected memory cell through the first and second current supply lines, each memory cell of said plurality of memory cells having a resistance value changeable in nonvolatile manner by receiving said write current flowing in a direction according to write data, said data write and read circuit reading data based on the resistance value of said selected memory cell detected by supplying said read current, and said data write and read circuit supplying said read current in a predetermined direction based on an absolute value of said write current required to change said resistance value for each direction in which said write current flows, wherein said plurality of memory cells are configured so that respective absolute values of said write current required to change said resistance value for respective directions in which said write current flows are substantially identical to each other, and said data write and read circuit supplies said read current in a direction identical to the direction of said write current supplied for changing said resistance value from a larger value to a smaller value.

14. The nonvolatile memory device according to claim 13, wherein said plurality of memory cells each have a magneto-resistance element magnetically storing data in nonvolatile manner, said magneto-resistance element includes:

first and second pinned magnetic layers having respective magnetization directions fixed in the same predetermined direction; and first and second free magnetic layers disposed between a first pinned magnetic layer and a second pinned magnetic layer, said first and second free magnetic layers have respective magnetization directions kept opposite to each other and changeable according to a direction in which an electric current supplied through said first and second current supply lines flows, and said magneto-resistance element has its resistance value changeable according to a relative relation between the magnetization direction of said first and second pinned magnetic layers and respective magnetization directions of said first and second free magnetic layers.

15. The nonvolatile memory device according to claim 14, wherein said first and second free magnetic layers have respective magnetization directions changed due to movement of spin-polarized electrons caused by an electric current supplied from said first and second current supply lines through said first and second pinned magnetic layers.

* * * * *